(12) United States Patent
Darcangelo et al.

(10) Patent No.: US 7,229,927 B1
(45) Date of Patent: *Jun. 12, 2007

(54) SEMICONDUCTOR PROCESSING SILICA SOOT ABRASIVE SLURRY METHOD FOR INTEGRATED CIRCUIT MICROELECTRONICS

(75) Inventors: Charles M. Darcangelo, Corning, NY (US); Robert Sabia, Corning, NY (US); Robert D. Sell, Horseheads, NY (US); Harrie J. Stevens, Corning, NY (US); Ljerka Ukrainczyk, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 539 days.

This patent is subject to a terminal disclaimer.

(21) Appl. No.: 10/130,963

(22) PCT Filed: Nov. 22, 2000

(86) PCT No.: PCT/US00/32077

§ 371 (c)(1),
(2), (4) Date: Aug. 27, 2002

(87) PCT Pub. No.: WO01/39260

PCT Pub. Date: May 31, 2001

Related U.S. Application Data

(60) Provisional application No. 60/167,121, filed on Nov. 23, 1999.

(51) Int. Cl.
*H01L 21/302* (2006.01)
*H01L 21/461* (2006.01)

(52) U.S. Cl. .......... 438/693; 257/E21.23; 257/E21.304
(58) Field of Classification Search ................ 438/692, 438/693
See application file for complete search history.

(56) References Cited

U.S. PATENT DOCUMENTS

| | | | | |
|---|---|---|---|---|
| 5,605,490 | A * | 2/1997 | Laffey et al. | 216/52 |
| 5,879,649 | A | 3/1999 | Henderson et al. | 423/337 |
| 5,997,620 | A * | 12/1999 | Kodama et al. | 106/3 |
| 6,043,159 | A * | 3/2000 | Jacquinot et al. | 438/693 |
| 6,159,077 | A * | 12/2000 | Sabia et al. | 451/36 |
| 6,261,476 | B1 * | 7/2001 | Kwok et al. | 252/79.1 |
| 6,322,425 | B1 * | 11/2001 | Darcangelo et al. | 451/41 |

FOREIGN PATENT DOCUMENTS

| | | |
|---|---|---|
| EP | 0 846 741 A | 6/1998 |
| EP | 0 896 042 A | 2/1999 |

OTHER PUBLICATIONS

P.C. Aitcin et al., "Physical And Chemical Characterization of Condensed Silica Fumes", Ceramic Bulletin, vol. 63, No. 12, 1984, pp. 1487-1491.

* cited by examiner

*Primary Examiner*—David A. Zarneke
(74) *Attorney, Agent, or Firm*—Gregory V. Bean

(57) ABSTRACT

The invention utilizes colloidal silica soot (62) in a semiconductor process for chemical-mechanical planarizing a semiconductor integrated circuit workpiece (24) with a slurry (60). The particulate abrasive agent colloidal solid sphere fused silica soot (62) provides a beneficial CMP slurry/process for semiconductor device manufacturing compared to standard semiconductor CMP slurries with conventional colloidal sol-gel or fumed silica.

116 Claims, 21 Drawing Sheets

1 μm

1 μm

SEMICONDUCTOR PROCESSING SILICA SOOT ABRASIVE SLURRY METHOD FOR INTEGRATED CIRCUIT MICROELECTRONICS

CROSS-REFERENCE TO RELATED APPLICATION

This application claims the benefit of priority of U.S. Provisional Application No. 60/167,121, filed Nov. 23, 1999, entitled Silica Soot Abrasive For Microelectronic Materials, of Darcangelo et al., which is hereby incorporated.

FIELD OF THE INVENTION

The present invention relates to planarization of a semiconductor substrate, and more particularly relates to chemical mechanical polishing (CMP) of semiconductor integrated circuit workpiece surfaces.

BACKGROUND OF THE INVENTION

Semiconductor integrated circuit chemical-mechanical planarizing slurries are utilized by the semiconductor industry in the manufacture of integrated circuit devices. Various semiconductor integrated circuit layers are stacked on top of a semiconductor substrate. The stacked layers are deposited and formed on the semiconductor substrate so that electrical connections can be made to the devices incorporated in the semiconductor substrate wafer and the devices can perform their intended functions (such as computations and computer processing). Chemical-mechanical planarization utilized in the stacking of such layers and formation of such electrical connections to remove deposited materials and provide flat planar surfaces.

Application of colloidal suspensions for polishing planarizing advanced materials has become an exceedingly critical aspect of final part formation for the semiconductor integrated circuit microelectronics industries. Silica and alumina colloids are formed through various techniques and typically require expensive precursor materials in order to ensure the highest purity products. Solutions are stabilized with buffer systems to pH and solids loading values that result in optimal semiconductor workpiece surface finish attainment. Particle size distribution can be adjusted to control the final surface finish as well as the ability to clean residue abrasive particles from workpiece surfaces after processing. The present invention describes the application of colloidal silica soot produced as a byproduct of chemical vapor deposition processing of glasses in the semiconductor integrated circuit finishing industry, specifically for application to silicon wafers, oxide coating on such wafers, conductive metals used in microelectronic devices (e.g., aluminum, copper, tantalum, tungsten, etc.), and ceramics used in microelectronics (e.g., silicon nitride and silicon carbide).

The abrasive particles of a CMP slurry effect the slurry chemistry and its use. The slurry solution must be adjusted to a pH that will allow for attainment of the best surface finish and the solution must be stabilized from agglomeration and pH shifts during storage. For conventional colloidal silica abrasives designed for microelectronic applications, buffers solutions using mixtures of various bases and salts are incorporated for stabilization anywhere between pH 5-12. Most common for colloidal silica solutions stabilized for single-crystal silicon polishing is a buffer adjustment to pH 10-11. For the Soot of the invention, a likewise adjustment can be made using a potassium-based buffer solution.

With regards to polishing of interconnecting metals in microelectronic integrated circuit devices (e.g., aluminum, copper, tantalum, tungsten, etc.) the soot materials offer advantages including (1) relatively large particle size (>0.25 µm) with spherical morphology and (2) added stabilization of $TiO_2$—$SiO_2$ over $SiO_2$. The inventive soot materials demonstrate four preferred points in specific application to the chemomechanical polishing (planarization) of microelectronic materials such as copper, aluminum, tungsten, and silicon as well as related carbides and nitrides:

First, the Ti doped soot shows significantly improved stability at low pH (<pH 5) as compared to the pure silica soot. This provides the doped soot with better dispersion properties and beneficial performance when being applied as a polishing compound at pH <5.

Second, the pure undoped fused silica soot is shown to be of greater resistance to dissolution at high pH (pH >5), suggesting that the soot would perform in a superior manner that the Ti doped soot for microelectronic applications in this pH range.

Third, the decreased surface area of the inventive soots (10-20 $m^2$/gram) as compared to competing silica particle materials (100-400 $m^2$/gram) such as fumed silica suggests that these soot particles can be dispersed in solution using less dispersion aids, thus eliminating sources of contamination or unwanted levels of dispersion aids used.

Fourth, the spherical nature and particle sizes of the inventive soot materials suggest that the mechanical performance of the soot materials used as abrasive particles would not scratch the surface being polished.

SUMMARY OF THE INVENTION

The invention includes a semiconductor processing method of chemical-mechanical planarizing a semiconductor device process surface. The semiconductor processing method includes providing a semiconductor integrated circuit workpiece which has a non-planarized integrated circuit workpiece surface. The method further includes providing a chemical-mechanical planarizing slurry which includes particulate abrasive agent colloidal solid sphere fused silica soot and planar abrading the integrated circuit workpiece surface with the colloidal silica soot to provide a planarized integrated circuit workpiece.

The invention includes a chemical-mechanical semiconductor integrated circuit manufacturing process. The integrated circuit manufacturing process includes providing a semiconductor integrated circuit workpiece. The process includes providing a chemical-mechanical fused silica soot slurry with particulate abrasive agent colloidal solid sphere fused silica soot particles and planarizing the integrated circuit workpiece with the fused silica soot slurry to provide a processed semiconductor integrated circuit workpiece surface.

The invention further includes a method of making a semiconductor processing chemical-mechanical planarizing slurry. The method includes providing a collection of particulate abrasive agent solid sphere fused silica soot particles and a semiconductor processing chemical-mechanical pre-slurry solvent and dispersing the particulate abrasive agent colloidal solid sphere fused silica soot particles in the pre-slurry solvent to form a semiconductor processing chemical-mechanical planarizing slurry mixture.

The invention further comprises a semiconductor processing chemical-mechanical planarizing slurry with particulate abrasive agent colloidal solid sphere fused silica soot particles dispersed in a semiconductor processing chemical-mechanical slurry solvent. The particulate abrasive agent colloidal solid sphere fused silica soot particles preferably being non-agglomerated individual solid sphere fused silica soot particles with a particle size distribution between 30 nm and 600 nm and a particle surface area no greater than 100 $m^2$/gram, more preferably no greater than 50 $m^2$/gram, and preferably a mean particle size in the range of 300-500 nm.

The inventive fused silica soot semiconductor processing chemical-mechanical planarizing slurries preferably provide beneficial semiconductor processing with deposited film removal rates that are $\geq 0.5$ μm/minute, particularly a metallic copper layer film removal rate of at least 0.5 μm/minute.

The inventive fused silica soot semiconductor processing chemical-mechanical planarizing slurries preferably provide beneficial film removal rates that are independent of solids loading (weight % of soot in the slurry). In particular greater than 0.5 μm/minute metallic copper layer film removal rates are provided by the slurry with the removal rate independent of the level of fused silica soot solids loading in the slurry with weight percent levels in the range of 1 to 10 wt. %, and preferably in the range of 1 to 6 wt. % of soot in the slurry.

The inventive fused silica soot semiconductor processing chemical-mechanical planarizing slurries preferably provide beneficial slurry stability with avoidance of agglomeration and gellation. The silica soot in the slurry is redispersed without agglomeration or gellation after stagnant settling times greater than 24 hours.

The inventive fused silica soot semiconductor processing chemical-mechanical planarizing slurries preferably provide planarized surface workpiece finishes with a surface finish $\leq 0.6$ nm RMS.

DESCRIPTION OF THE DRAWINGS

FIG. 22 (a-f) are plots of shear rate (1/sec) vs. shear stress (D/$cm^2$) of the compared silica particles in slurry. The open circle shows high purity fused silica soot in accordance with the invention. The open square designates the Degussa® fumed silica. The open triangle designates the Cabot® fumed silica.

DETAILED DESCRIPTION OF THE INVENTION

Figure 1:
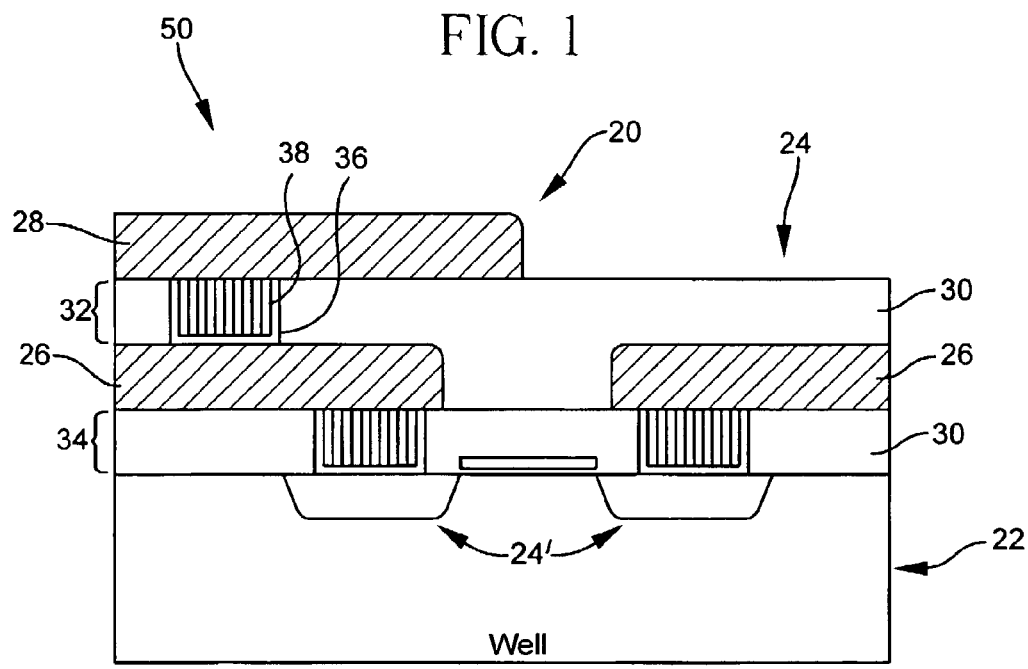
FIG. 1 is a cross-sectional side view of a semiconductor device integrated circuit workpiece.
Figure 2:
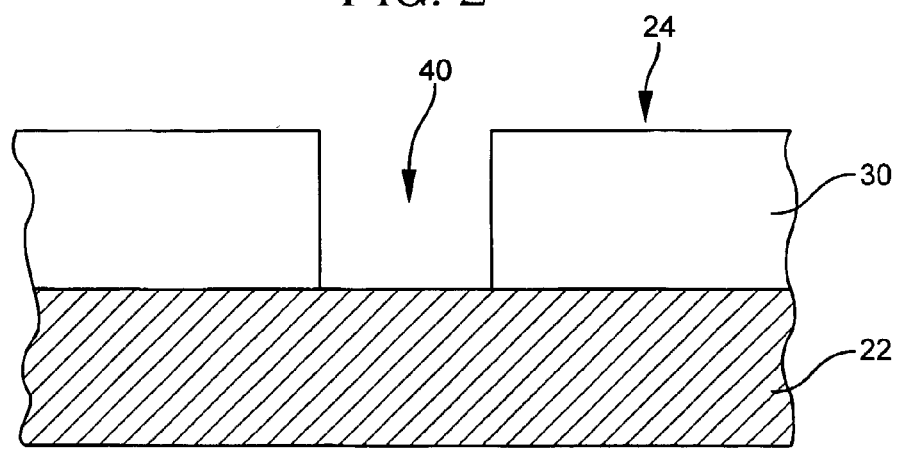
FIG. 2 is a cross-sectional side view of a semiconductor integrated circuit workpiece illustrating process steps in accordance with the invention.
Figure 3:
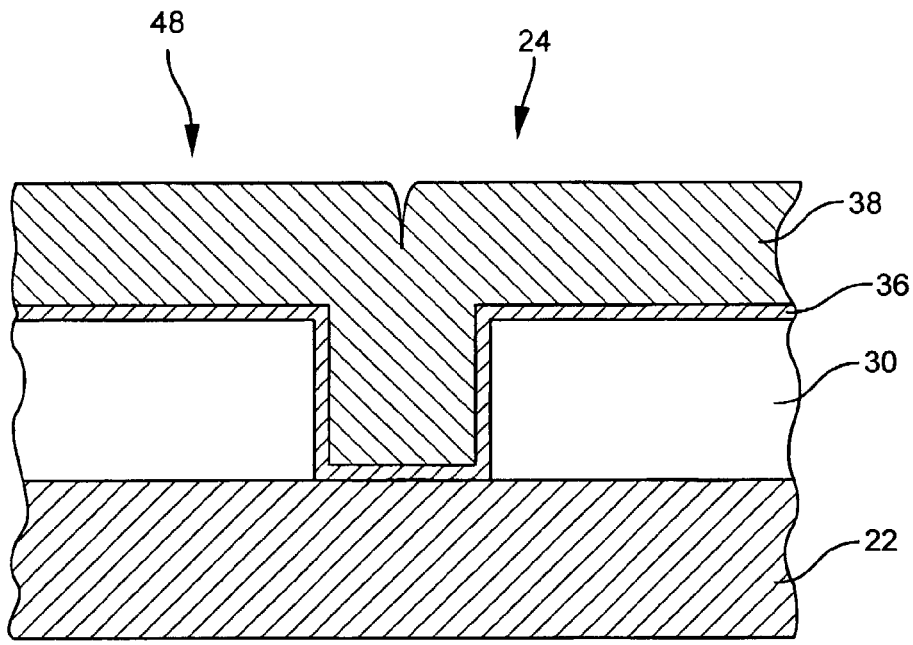
FIG. 3 is a cross-sectional side view of a semiconductor integrated circuit workpiece illustrating process steps in accordance with the invention.
Figure 4:
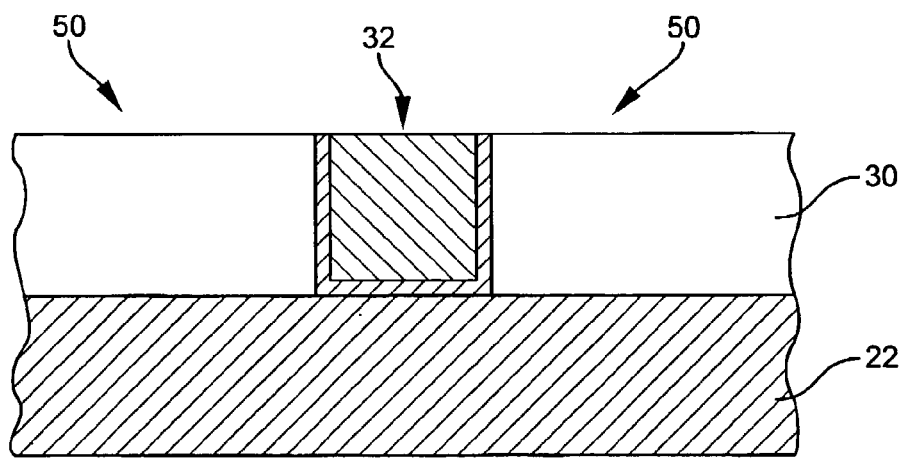
FIG. 4 is a cross-sectional side view of a semiconductor integrated circuit workpiece illustrating process steps in accordance with the invention.

The invention includes a semiconductor processing method of chemical-mechanical planarizing a semiconductor device process surface. As shown in FIG. 1, a semiconductor integrated circuit device 20 is comprised of a plurality of layers which are successively formed on top of a semiconductor substrate 22 such as a silicon wafer. In the making of a semiconductor integrated circuit device 20 the successively formed layers are preferably made by depositing semiconductor processing films on the upper exposed surface of the integrated circuit workpiece 24 with the upper exposed surface being a chemical-mechanical planarized integrated circuit workpiece process surface. Integrated circuits semiconductor devices 20 are made of active semiconductor designed devices formed in or on a silicon substrate or well such as by optical lithography where integrated circuit designs are transferred from a mask onto a substrate wafer. The active devices which are initially isolated from one another are later connected together to form functional integrated circuits and components. The devices are interconnected together through the use of multilevel interconnections. A cross-sectional illustration of a typical multilevel interconnection structure 20 is shown in FIG. 1. Interconnection structures can have a first layer of metallization, an interconnection layer 26, a second level of metallization 28, and sometimes a third or even fourth level of metallization. Interlevel dielectrics 30 (ILDs), such as doped and undoped silicon dioxide, are used to electrically isolate the different levels of metallization and silicon substrate 22 or well. The electrical connections between different interconnection levels are made through the use of metallized plug vias 32 formed in ILD 30. In a similar manner, metal plug contacts 34 are used to form electrical connections between interconnection levels and devices formed in the well. The metal vias 32 and contacts 34, hereinafter being collectively referred to as "vias" or "plugs", are generally filled with a conductive metal such as tungsten and generally employ a metal adhesion layer such as TiN. Adhesion and diffusion layer 36 acts as an adhesion layer for the metal layer 38 which may adhere poorly to the ILD electrical insulator material. In semiconductor processing and manufacturing procedures for semiconductor integrated circuit workpieces 24 metallized vias or contacts are formed by a blanket conductive metal film deposition and a chemical mechanical polish (CMP) process. In such a process as shown in FIG. 2, via holes 40 are etched through an ILD 30 to conductive metal interconnection lines or a semiconductor substrate 22 formed below. As shown in FIG. 3, a thin metal adhesion layer 36, such as TiN, is formed over ILD 30 and into via hole 40. Next, a conformal layer conductive metal film 38 is blanket deposited over the adhesion layer and into the via 40. The deposition is continued until the via hole 40 is completely filled with conductive metal 38. As shown in FIG. 4 the metal films formed on the top workpiece surface of ILD 30 are removed by chemical mechanical planarizing, thereby forming metal vias or plugs 32.

Figure 5:
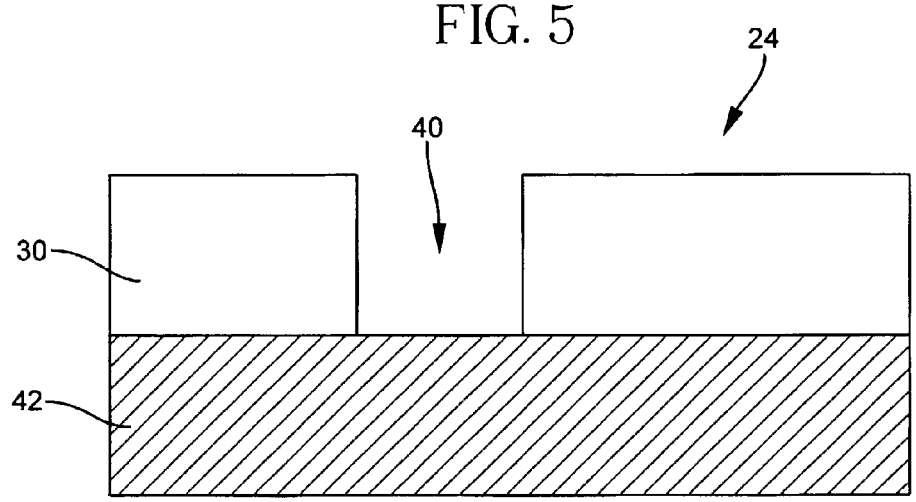
FIG. 5 is a cross-sectional side view of a semiconductor integrated circuit workpiece illustrating process steps in accordance with the invention.
Figure 6:
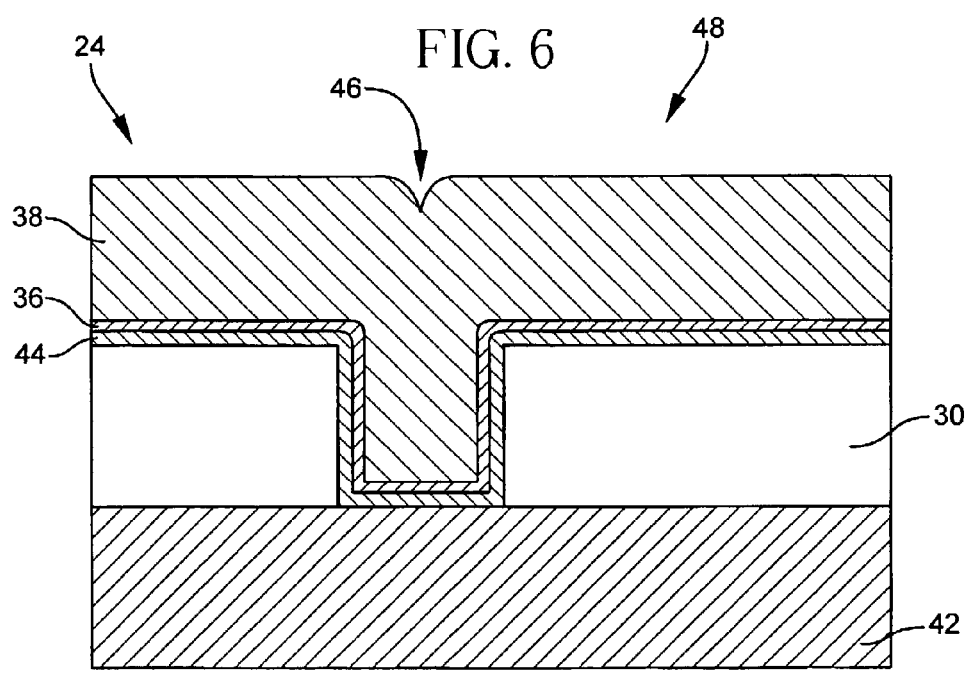
FIG. 6 is a cross-sectional side view of a semiconductor integrated circuit workpiece illustrating process steps in accordance with the invention.

FIG. 5, further illustrates the semiconductor process. In the fabrication of a contact or via connection between two conductive layers of an integrated semiconductor circuit, a semiconductor integrated circuit workpiece substrate wafer 24 is provided. The workpiece 24 at this point is a substrate with a conductive layer 42 as the top most layer. The conductive layer 42 can be any one of a variety of conductive materials used in semiconductor circuit manufacturing including but not limited to a metal layer, a semiconductor such as silicon, a doped semiconductor, a polysilicon layer or a metal silicide layer. An interlayer dielectric (ILD) 30 is formed over conductive layer 42. Interlayer dielectric 30 is a thin film insulator which is generally an undoped silicon dioxide formed by plasma enhanced CVD of TEOS between interconnection layers. A phosphosilicate (PSG) or borophosphosilicate (BPSG) film is generally used between polysilicon and metal layers. It is to be appreciated that other insulating layers, such as silicon nitride, or multilayer composite dielectrics, including such things as spin on glass, may also be used. Low-K dielectrics may be used as the ILD. The function of interlayer dielectric 30 is to electrically isolate conductive layer 42 from a subsequently formed conductive layer. Interlayer dielectric 30 can be formed by techniques well-known in the art. An opening or via hole 40 is formed in interlayer dielectric 30. A photoresist layer is formed over ILD 30 which is then masked, exposed, and developed with techniques well-known in the art to define the location for via hole 40. The insulating layer 30 is then anisotropically etched with techniques well-known in the art to form via hole 40. Via hole 40 is etched until conductive layer 42 is reached. A via hole with substantially vertical side walls and a large aspect ratio (aspect ratio=via depth/via width) is desired. Such a via hole is compatible with the high packing density required for ultra large scale integrated (ULSI) circuits. Next, as shown in FIG. 6, an adhesion layer or adhesions layers, if used, are blanket deposited over ILD 30. A titanium (Ti) contact layer 44 is blanket deposited over the top surface of ILD 30, on the sides of ILD 30 in via hole 40 and on conductive layer 44 in via hole 40. The function of titanium contact layer 44 is to decrease the contact resistance of the fabricated plug in order to improve electrical performance. Titanium layer 44 also acts as a polish stop for tungsten and/or TiN planarizing steps described below. Titanium contact layer 44 is formed to a thickness of approximately 200 angstroms and can be formed by well-known means, such as sputtering from a titanium target. Next, a titanium nitride (TiN) layer 36, of a thickness of approximately 600 angstroms, is blanket deposited over titanium layer 44. Titanium nitride layer 36 can be formed by any one of a plurality of well-known techniques, including but not limited to, reactive sputtering from a titanium target in a nitrogen atmosphere and chemical vapor deposition (CVD). Titanium nitride layer 36 provides an adhesion layer and a diffusion barrier for a subsequently deposited tungsten layer which is known to have poor adhesion to insulators like $SiO_2$, and high reactivity with metals such as aluminum and titanium. Efforts should be made to form titanium layer 44 and titanium nitride layer 36 as conformally as possible so that high aspect ratio vias can be reliably formed. It is to be appreciated that other adhesion layers, such as tungsten silicide formed by chemical vapor deposition, may be used if desired. Next, as also shown in FIG. 6, a tungsten (W) conductive metal layer 38 is blanket deposited over TiN layer 36. The deposition completely fills via hole 40 with tungsten. The deposition forms a thick tungsten layer on the top surface of ILD 30. A slight dimple 46 may result in the top portion of tungsten layer 38 over via hole 40. Tungsten layer 38 is formed to a thickness between 4000-5000 angstroms for an 4500 angstroms diameter plug. Tungsten layer 38 can be formed by CVD using hydrogen reduction of tungsten hexafluoride. An Applied Materials Precision 5000 deposition system can be used for depositing tungsten layer 38. The tungsten conductive metal layer adheres well to underlying TiN adhesion layer 36 and the titanium layer 44 forms a good ohmic contact with conductor layer 42 below.

Figure 7:
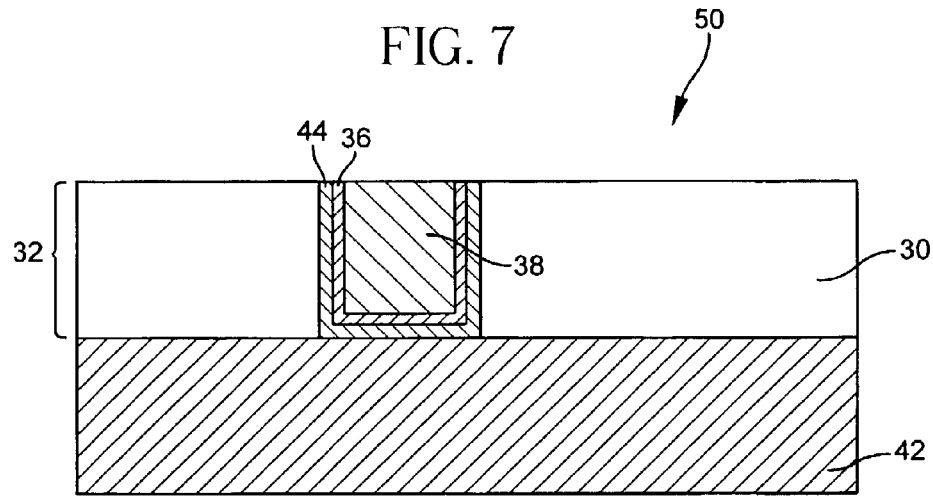
FIG. 7 is a cross-sectional side view of a semiconductor integrated circuit workpiece illustrating process steps in accordance with the invention.

In accordance with the invention the non-planarized integrated circuit workpiece surface 48 of the semiconductor integrated circuit workpieces are chemical-mechanical planarized with a solid sphere fused silica soot chemical-mechanical planarizing slurry. The inventive fused silica soot slurry is utilized to remove conductive metal layer 38 to transform the semiconductor workpiece non-planarized surface 48 into a planarized integrated circuit workpiece 50. As shown in FIG. 7, the planarized integrated circuit workpiece 50 is formed by removal of non-planarized workpiece surface 48 of FIG. 6. Similarly the inventive solid sphere fused silica soot chemical-mechanical planarizing slurry of the invention is utilized to transform the non-planarized semiconductor workpiece surface 48 of FIG. 3 into the planarized integrated circuit workpiece 50 of FIG. 4.

Figure 8:
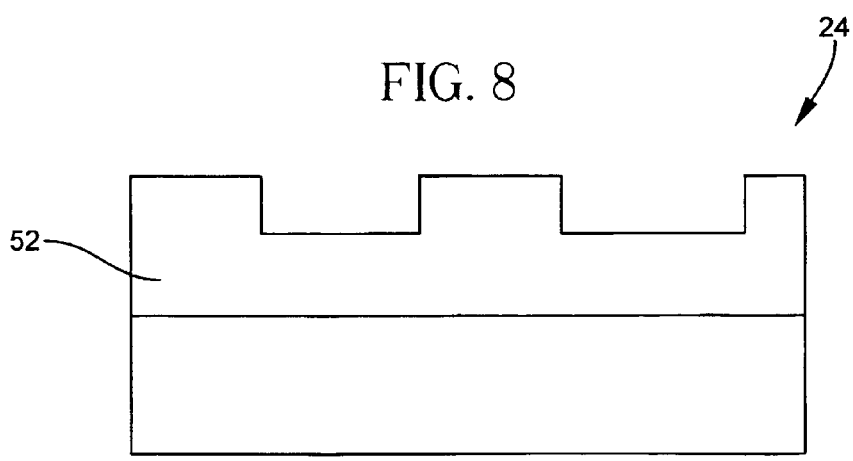
FIG. 8 is a cross-sectional side view of a semiconductor integrated circuit workpiece illustrating process steps in accordance with the invention.
Figure 9:
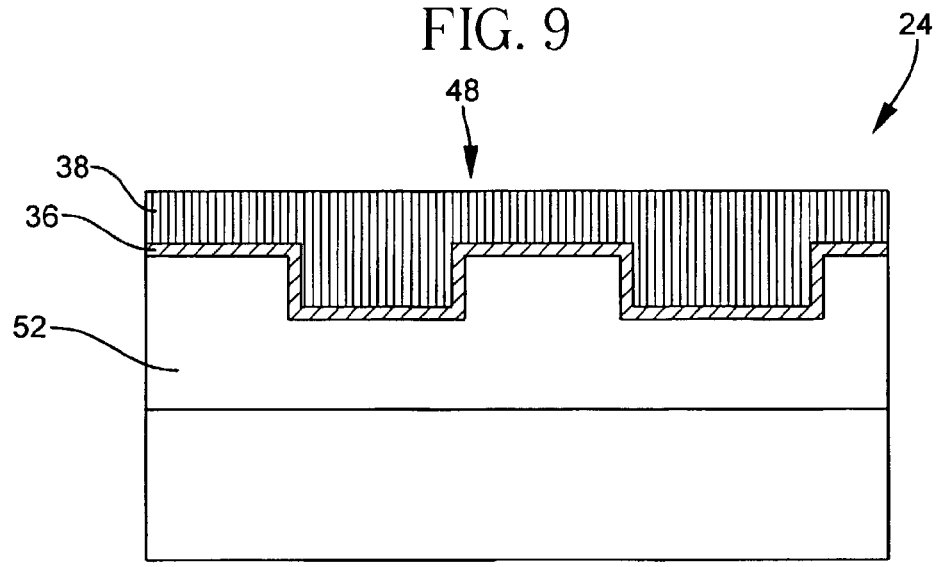
FIG. 9 is a cross-sectional side view of a semiconductor integrated circuit workpiece illustrating process steps in accordance with the invention.
Figure 10:
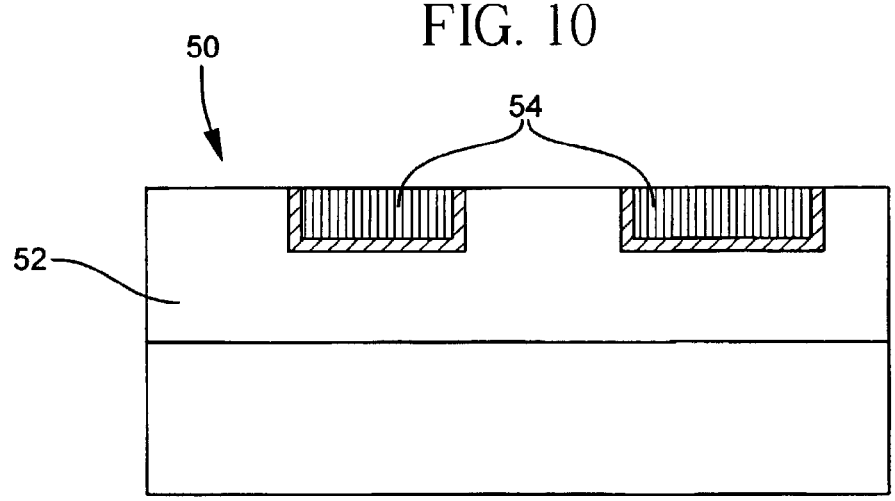
FIG. 10 is a cross-sectional side view of a semiconductor integrated circuit workpiece illustrating process steps in accordance with the invention.

As shown in FIG. 8-10, the inventive method of abrading and planarizing semiconductor integrated circuit films, such as conductive metal layer 38, includes polishing back deposited conductive metal layers to form interconnection lines 54, in addition to the formation of plugs 32. The solid sphere fused silica soot chemical-mechanical planarizing slurry of the invention can be used in integrated circuit manufacturing processes to form electrically conductive structures in addition to contacts and vias.

Figure 11:
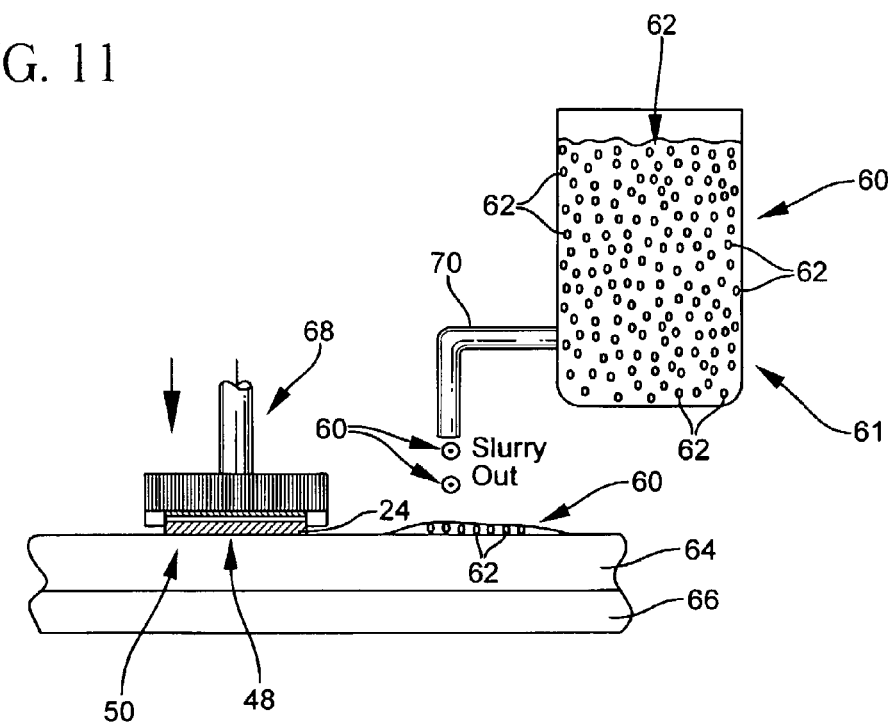
FIG. 11 is a side view of a semiconductor process method in accordance with the invention.
Figure 12:
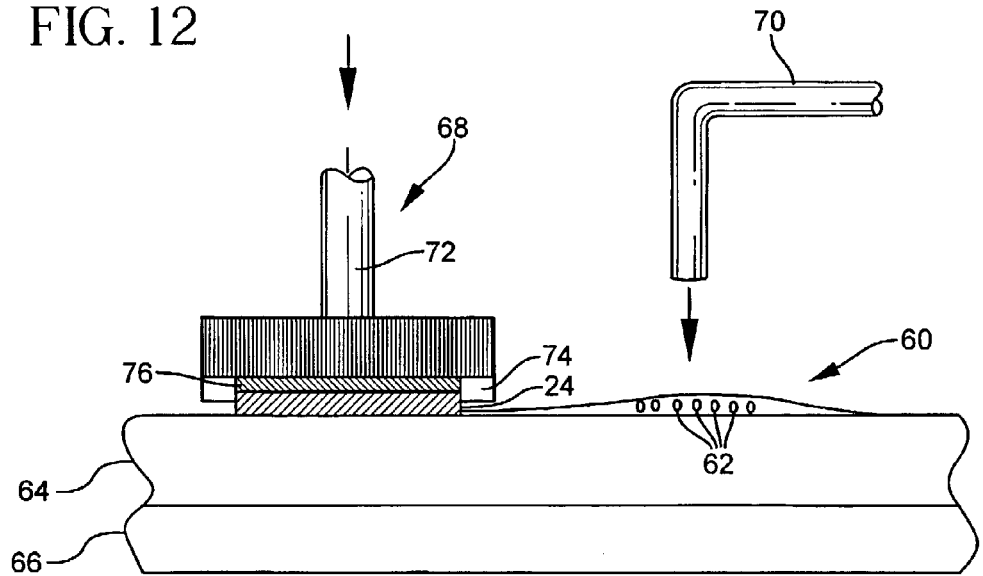
FIG. 12 is a side view of a semiconductor process method in accordance with the invention.

The inventive semiconductor processing method of chemical-mechanical planarizing a semiconductor device process surface includes providing a semiconductor integrated circuit workpiece 24 having a non-planarized integrated circuit workpiece surface 48. As shown in FIG. 11 the semiconductor processing method includes providing a chemical-mechanical planarizing slurry 60 that includes particulate abrasive agent colloidal solid sphere fused silica soot 62. The method includes abrading planarizing the integrated circuit workpiece surface 48 with the colloidal silica soot 62 of slurry 60 to provide a planarized integrated circuit workpiece 50. As shown in FIG. 12, the tungsten conductive metal layer 36, and the titanium contact layer 44 of FIG. 6 are chemical mechanically polished back to form metallized plugs. The workpiece 24 is placed face down on a polishing pad 64 attached to a rotatable table 66. In this way the thin film to be polished (i.e. conductive metal layer) is placed in direct contact with polishing pad 64. A carrier 68 is used to forcibly press semiconductor substrate workpiece 24 down against polishing pad 64 during polishing. Planarizing slurry 60 is deposited onto polishing pad 64 from a slurry providing nozzle 70 during the planarizing abrading polishing. Slurry 60 chemically passivates or oxidizes the thin film being polished and then abrasively removes or polishes off the passivated surface. The planarization removal of the thin film is facilitated by the chemically reactive slurry as pad 64 and substrate workpiece 24 are rotated relative to one another under a polishing pressure applied by carrier 68. Polishing is continued in this manner until the desired planarization is achieved or the desired amount of film is removed.

Polishing pad 64 can be formed of a variety of different materials. For example, polishing pad 64 can be a hard pad such as the IC-60 pad manufactured by Rodel Corporation. Additionally, polishing pad 64 can be a relatively soft pad such as the Polytech Supreme pad also manufactured by Rodel Corp. A soft polishing pad is thought to provide improved polish removal rates and improved uniformity. What is important, however, is for polishing pad 64 to adequately and uniformly deliver slurry across the entire wafer/pad interface. A plurality of preformed grooves can be added to pad 64 to help transport slurry about the wafer/pad interface. Additionally, slurry need not be simply deposited onto pad 64 from a nozzle 70, as shown in FIGS. 11-12, but rather can be pumped through the polishing pad directly to the wafer pad interface. Additionally, polishing pad 64 need not necessarily rotate to facilitate abrasive polishing, but rather may move in other directions, such as in an orbital direction with a radius less than the substrate radius.

A carrier similar to carrier 68 can be used to forcibly press and rotate wafer 24 against polishing pad 64 during polishing. A shaft 72 is used to apply a downward force (between 2-12 psi) and to rotate substrate 24 during polishing. A retaining ring 74 can be used to prevent substrate 24 from slipping laterally during polishing. An insert pad 76 is preferably used to cushion substrate 24 from carrier 68. Wet surface tension or vacuum pressure can be used to hold wafer 24 in place.

Providing semiconductor integrated circuit workpiece 24 having a non-planarized integrated circuit workpiece surface 48 includes providing a semiconductor integrated circuit workpiece 24 with a conductive metallized interconnection structure 38 such as interconnecting layer 26, 28, plugs 32 or metal contacts 34. Providing workpiece 24 preferably includes providing a semiconductor integrated circuit silicon wafer 22, preferably with a lithographic integrated circuit silicon wafer 22 with a lithographic integrated circuit pattern 24' and depositing at least one metallization interconnection layer 26, 28 formed from conductive metal 38. Providing workpiece 24 preferably includes providing a semiconductor integrated circuit workpiece 24 with an inter-level dielectric (ILD) structure, preferably with the method including depositing an inter-level dielectric.

It is to be appreciated that the slurries and chemical mechanical polishing processes of the present invention can be used to planarize various semiconductor integrated circuit workpiece surfaces and abrade/polish away deposited integrated circuit films/layers. For example, the slurry and CMP process of the present invention can be applied to the formation of a copper interconnection layer. As shown in FIG. 8, an insulating layer 52 is patterned to provide openings or grooves where interconnection lines are to be formed. An adhesion layer/diffusion barrier 36, such as TiN or Tantalum or Tantalum Nitride, is then formed over the insulating layer and into the grooves covering the sides and the bottom of the groove, as shown in FIG. 9. A conductive metal copper layer 38 is then formed with well-known techniques over the adhesion layer and deposited until the grooves are substantially filled. The non-planarized surface 48 of copper layer 38 and the adhesion layer 36 on the top surface of the insulating layer 52 are then chemically mechanically polished back, as in the plug process, as shown in FIG. 10 to provide interconnection lines 54. The novel solid sphere fused silica soot slurry 60 of the present invention can be used to polish integrated circuit copper. The slurry has beneficial removal rates and characteristics and provides good local and global polish uniformity. The slurries and chemical mechanical planarizing process of the present invention make possible the use of high performance, planar, copper interconnection lines 54.

Figure 13:
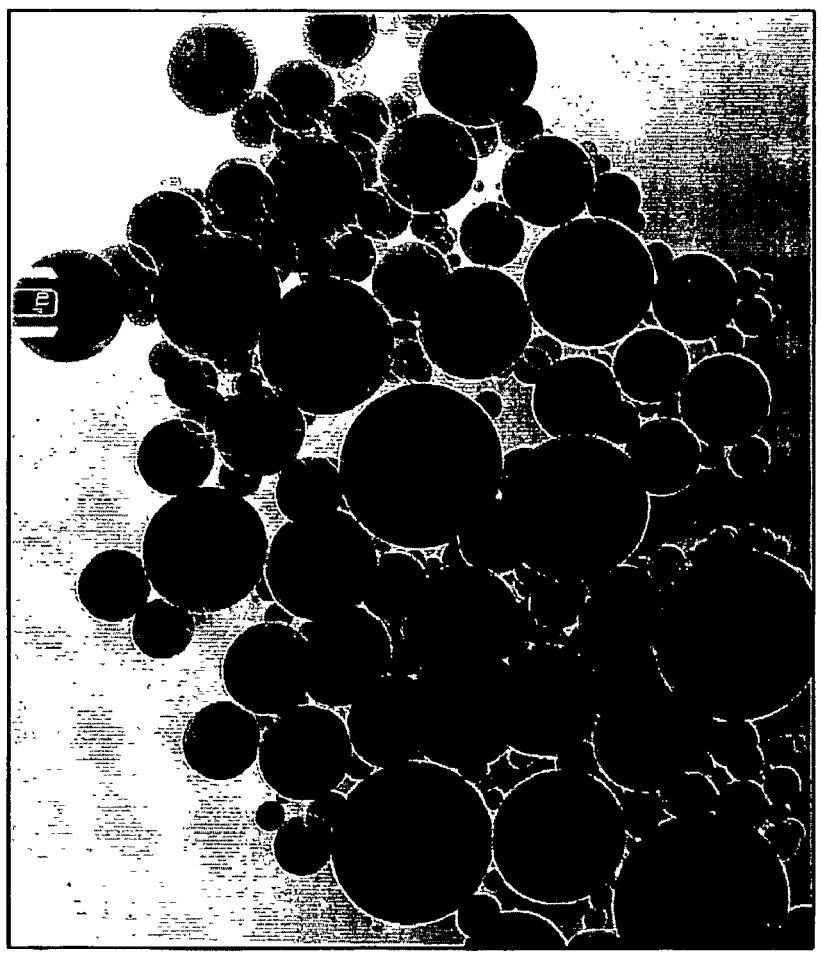
FIG. 13 is a transmission electron micrograph (TEM) image showing silica soot in accordance with the invention.

The particulate abrasive agent solid sphere fused silica soot 62 of the invention are shown in the transmission electron microscopic (TEM) image of FIG. 13. Solid sphere fused silica soot 62 are individual nonporous discrete fused glass spheres as contrasted with fumed silica particles [with fume silica particle being agglomerates (10-50 micrometers) of aggregates (100 to 500 nanometers) of primary particles (10 nanometers), with fume silica particles being open structured and macroporous with high specific surface areas, see The Product by Wacker, www.wacker.de/english/hdk/produkt_e.htm, Oct. 5, 1999]. Solid sphere fused silica soot 62 is preferably produced during a glass manufacturing chemical vapor deposition process at high temperatures where the glass particles form discrete separate individual glass soot spheres. Preferably solid sphere fused silica soot 62 is a byproduct a glass manufacturing chemical vapor deposition process wherein the soot 62 is the escaped soot that avoids its intended deposition surface and escapes from the glass manufacturing process as an exhausted particulate pollutant byproduct in the glass furnace exhaust. The formation of high purity fused silica soot is generated by high temperature flame hydrolysis or flame combustion processes. High purity silicon containing chemical feedstock is introduced into an oxygen-hydrocarbon, or oxygen-hydrogen flame, to generate silica intermediates preferably in an insulated enclosure which is maintained at temperatures above 1600° C. The silica intermediates include "seeds" of solid silicon dioxide in the nanometer size range, gaseous silicon monoxide, and other intermediate silicon containing compounds from the flame hydrolysis or flame combustion reactions. Preferably, the insulating enclosure is designed in such a way that the silica intermediates experience prolonged residence time under high temperature (>1600° C.) within the enclosure, during which the solid silicon dioxide "seeds" grow and sinter simultaneously at high temperature (preferably >than 1300° C.) to generate larger solid separate discrete individual sphere particles before exiting the enclosure. Titanium doped silica soot is a byproduct of Corning Incorporated's ultra low expansion (ULE™) glass making chemical vapor deposition process. It has similar characteristics to high purity fused silica soot produced by Corning Incorporated's high purity fused silica (HPFS™) glass except for its composition. As an alternative to solid sphere fused silica soot 62 being an exhausted byproduct from a glass making chemical vapor deposition process, soot 62 can be intentionally produced as described in pending U.S. patent application Ser. No. 09/458,898, filed Dec. 10, 1999, entitled Process For Producing Silica Soot, of Kar et al., incorporated herein by reference.

Providing slurry 60 with particulate abrasive agent colloidal silica soot 62 preferably includes providing soot particles 62 with a particle size >0.25 μm (250 nm). In a preferred embodiment, soot particles 62 have a particle size distribution between 30 nm and 600 nm. Soot 62 are spherical soot particles which are near perfectly spherical if not perfect spheres, with the spheres being non-agglomerated individual spheres, particularly in comparison to fumed silica particles which may have rounded shapes but are non-spherical in terms of the macroparticle shape profile. In a preferred embodiment, soot particles 62 are high purity fused silica soot particles, preferably which consist essentially of $SiO_2$. Preferably the high purity fused silica glass has an OH content by weight >500 ppm ≧800 ppm, preferably in the range of 800-1100 ppm, and an impurity level other than OH that is no greater than 1,000 ppb, preferably with a non-OH impurity level in the range of 100-1000 ppb, with the glass in a high purity bulk glass body state having high transmissions (>90%/cm) at UV wavelengths >200 nm. In an alternative preferred embodiment, soot particles 62 are doped fused silica glass particles 62 which are preferably Ti doped fused silica glass soot particles ($SiO_2$—$TiO_2$ glass), most preferably a Ti doped ultra low expansion glass with a CTE of 0±30 ppb/° C. from 5° to 35° C., such as Corning Incorporated ULE™ glass. Preferably the Ti doped soot 62 has a $TiO_2$ wt. %<10 wt. %, and more preferably is about 7 wt. % $TiO_2$ (7±1 wt. % $TiO_2$). In further embodiments soot particles 62 can be doped with other fused silica glass dopants, preferably fused silica glass dopants which change the refractive index of the fused silica glass. In a preferred embodiment the soot 62 is a fused silica glass doped with an optical waveguide dopant, preferably with the fused silica glass soot a byproduct of an optical waveguide glass chemical vapor deposition process. In an embodiment soot 62 is a Ge (germanium) doped fused silica glass soot. In a further embodiment soot 62 is an Al (aluminum) doped fused silica glass soot. In an embodiment soot 62 is a B (boron) doped fused silica glass soot. In an embodiment soot 62 is a P (phosphorus) doped fused silica glass soot. In a further embodiment soot 62 is an Er (erbium) doped fused silica glass soot. In an embodiment soot 62 is a Ce (cerium) doped fused silica glass. In a preferred embodiment soot 62 is doped with a lanthanide series metal of the Periodic Table of Elements. In a further embodiment soot 62 is a Zr doped fused silica glass.

Providing chemical-mechanical planarizing slurry 60 includes providing particulate abrasive agent colloidal silica particles 62 with a mean particle size in the range of 300 to 500 nm (0.3 to 0.5 μm). Preferably soot 62 have a particle surface area less than 100 $m^2$/gram, more preferably no greater than 50 $m^2$/gram, and most preferably no greater than 20 $m^2$/gram. In a preferred embodiment soot 62 has a particle surface area in the range of about 10 to 20 $m^2$/gram. The chemical-mechanical planarizing slurry 60 has a stabilized dispersion viscosity. Preferably the soot 62 has a surface activity ≧$1.5 \times 10^{-5}$ moles/meter. In a preferred embodiment soot 62 is high purity fused silica and has an intrinsic $pK_{a1}$ of 0.0±0.2 and an intrinsic $pK_{a2}$ of 7.0±0.1, preferably fused silica soot 62 having an isoelectric point ($pH_{IEP}$) of about 3.5±0.1. In an alternative preferred embodiment, soot 62 is a doped fused silica glass soot, with the dopant raising or lowering the $pK_{a1}$ and $pK_{a2}$, and the $pH_{IEP}$ of the fused silica soot with an intrinsic $pK_{a1}$ of 0.0±0.1 and an intrinsic $pK_{a2}$ of 5.0±0.2, and preferably with a lowered isoelectric point ($pH_{IEP}$) of 2.5±0.1. Preferably Ti doped fused silica glass soot 62 has an increased insolution surface charge compared to that of high purity fused silica pure $SiO_2$ soot particles. Preferably Ti doped fused silica glass soot 62 has an increased slurry stability at low pH values <5.0 compared to that of high purity fused silica pure $SiO_2$ soot particles. Slurry 60 with soot 62 has an insolution stability with soot particles 62 being agglomeration resistant, gellation resistant, and having a stabilized viscosity, particularly when compared to fumed silica particles. Slurry 60 is stable in that the slurry has Newtonian viscosity, little to no agglomeration, and little to no gellation, with loadings in slurry from 1 to 15 weight %, preferably with stability maintained above 3 wt. %. Fumed silica slurries become unstable and difficult to manage at loadings in slurry above 3 wt. %.

The invention includes a chemical-mechanical semiconductor integrated circuit manufacturing process. The inventive process includes providing a semiconductor integrated circuit workpiece 24, providing a chemical-mechanical fused silica soot slurry 60 comprised of particulate abrasive agent colloidal solid sphere fused silica soot particles 62, and planarizing the semiconductor workpiece 24 with the fused silica soot slurry 60 to provide a processed planarized semiconductor integrated circuit workpiece surface 50. Providing semiconductor integrated circuit workpiece 24 preferably includes forming a semiconductor integrated circuit film, preferably a conductive metal film, and planarizing the formed film. In an embodiment the semiconductor integrated circuit film is a tungsten film. In an embodiment the semiconductor integrated circuit film is a tungsten silicide film. In an embodiment the semiconductor integrated circuit film is a copper film. In an embodiment the semiconductor integrated circuit film is a titanium nitride film. In an embodiment the semiconductor integrated circuit film is an aluminum alloy film. In an embodiment the semiconductor integrated circuit film is a tantalum film. In an embodiment the semiconductor integrated circuit film is a tantalum nitride film. Providing a semiconductor integrated circuit workpiece 24 preferably includes providing a workpiece with a conductive layer 38. Providing a semiconductor integrated circuit workpiece 24 preferably includes providing a workpiece with an interlayer dielectric, which can include silica based insulators, silicon nitride and low K dielectrics. In a preferred embodiment, planarizing includes polishing back at least one deposited layer to form a conductive metallized plug 32. In a preferred embodiment, planarizing includes polishing back at least one deposited layer to form an interconnection line 54.

Soot particles 62 of slurry 60 preferably have a particle size distribution between 30 nm and 600 nm. Preferably soot particles 62 are high purity fused silica soot particles. In a preferred embodiment soot particles 62 are doped fused silica glass soot particles, preferably Ti doped fused silica glass soot particles. Soot particles 62 of slurry 60 preferably have a mean particle size in the range of 300 to 500 nm. Preferably soot particles 62 have a particle surface area less than 100 m$^2$/gram, more preferably no greater than 50 m$^2$/gram and most preferably no greater than 20 m$^2$/gram. Preferably soot particles 62 have a particle surface area in the range of about 10 to 20 m$^2$/gram. Preferably slurry 60 has a stabilized dispersion viscosity, with soot 62 having an insolution stability. Soot particles 62 preferably have a surface activity $\geq 1.5 \times 10-5$ moles/meter. Soot particles 62 preferably have an insolution stability with soot particles agglomeration resistant in slurry 60. Soot particles 62 preferably have an insolution stability with soot particles gellation resistant in slurry 60.

In an embodiment soot particles 62 are coated with cerium, iron, zirconium, aluminum, or oxides formed thereof.

The invention includes a method of making a semiconductor processing chemical-mechanical planarizing slurry. The method includes providing a semiconductor processing chemical-mechanical pre-slurry solvent 61 and dispersing soot particles 62 in solvent 61 to form a semiconductor processing chemical-mechanical planarizing slurry. Pre-slurry solvent 61 is preferably a water based slurry solvent. Solvent 61 of slurry 60 is preferably a purified distilled deionized H$_2$O liquid. Dispersing of soot 62 in solvent 61 is provided by shear mixing. Slurry 60 and solvent preferably include chemical additives such as oxidizing agents, for example hydrogen peroxide and nitric acid for copper dissolution, and inhibitors such as benzo-tri-azole (BTA).

The method of making slurry 60 includes loading at least 1 wt. % of the soot, and more preferably greater than 3 wt. % of the soot in the slurry. Loading at least 1 wt. % preferably includes loading up to 15 wt. % soot into the slurry. With a slurry pH in the range of 1 to 12, more preferably a pH $\leq 7$, the slurry has stability with loadings in the 3 to 10 wt. % range. The soot slurry 60 has beneficial stability at loadings greater than 3 wt. % as compared to fumed silica slurries, and particularly beneficial 3 and 6 wt. % loadings with low pH's <7. The method includes dispersing a greater than 3 wt. %, preferably 6 wt. %, more preferably 10 wt. % loading of soot wherein the slurry is agglomeration inhibited, gellation inhibited, and has a stabilized viscosity.

Particulate abrasive agent silica soot 62 preferably are non-agglomerated solid sphere fused silica soot particles with a particle size distribution between 30 nm and 600 nm. Preferably soot 62 is a high purity fused silica soot. In a preferred embodiment soot 62 is a doped fused silica glass soot. In an embodiment the doped fused silica glass soot 62 is a Ti doped fused silica glass soot. In an embodiment the doped fused silica glass soot 62 is a Ge doped fused silica glass soot. In an embodiment the doped fused silica glass soot 62 is an Al doped fused silica glass soot. In an embodiment the doped fused silica glass soot 62 is a B doped fused silica glass soot. In an embodiment the doped fused silica glass soot 62 is a P doped fused silica glass soot. In an embodiment the doped fused silica glass soot 62 is a Zr doped fused silica glass soot. In an embodiment the doped fused silica glass soot 62 is a Er doped fused silica glass soot. In an embodiment the doped fused silica glass soot 62 is a Ce doped fused silica glass soot. In an embodiment the doped fused silica glass soot 62 is a lanthanide metal doped fused silica glass soot.

Particulate abrasive agent silica soot 62 are preferably soot particles having a mean particle size in the range of 0.3 to 0.5 μm. Preferably soot 62 have a particle surface area less than 100 m$^2$/gram, more preferably no greater than 50 m$^2$/gram, and more preferred no greater than 20 m$^2$/gram. In a preferred embodiment soot 62 has a particle surface area in the range of about 10 to 20 m$^2$/gram.

Soot particles 62 preferably have a surface activity $\geq 1.5 \times 10^{-5}$ moles/meter. Preferably soot 62 has an intrinsic pK$_{a1}$ of $0.0 \pm 0.2$ and a n intrinsic pK$_{a2}$ of $7.0 \pm 0.1$, preferably with an isoelectric point of $3.5 \pm 0.1$. In a further embodiment soot 62 has an intrinsic pK$_{a1}$ of $0.0 \pm 0.1$ and a n intrinsic pK$_{a2}$ of $5.0 \pm 0.2$, preferably with an isoelectric point of $2.5 \pm 0.1$. In the preferred Ti doped soot 62, the soot have an increased insolution surface charge over that of pure SiO$_2$. The Ti doped soot have an increased low pH stability insolution at pH values <5.0, which is improved stability over pure undoped high purity SiO$_2$.

Figure 14:
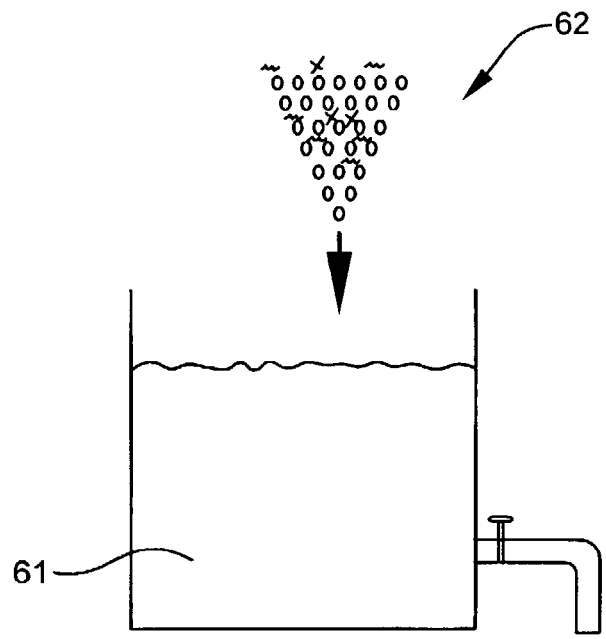
FIG. 14 is a side view of a method in accordance with the invention.
Figure 15:
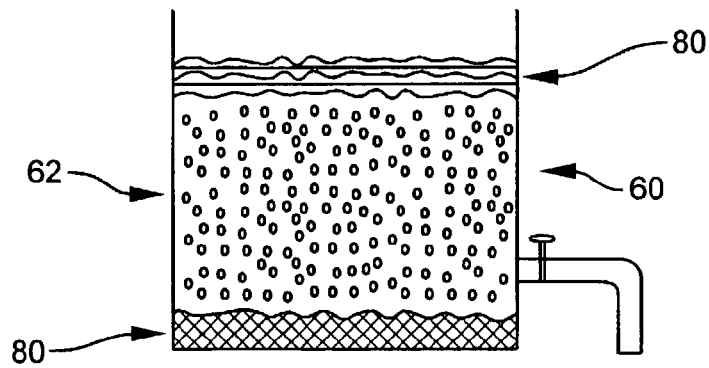
FIG. 15 is a side view of a method in accordance with the invention.
Figure 15:
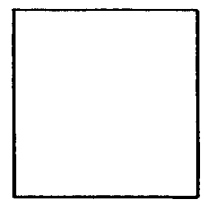
Figure 16:
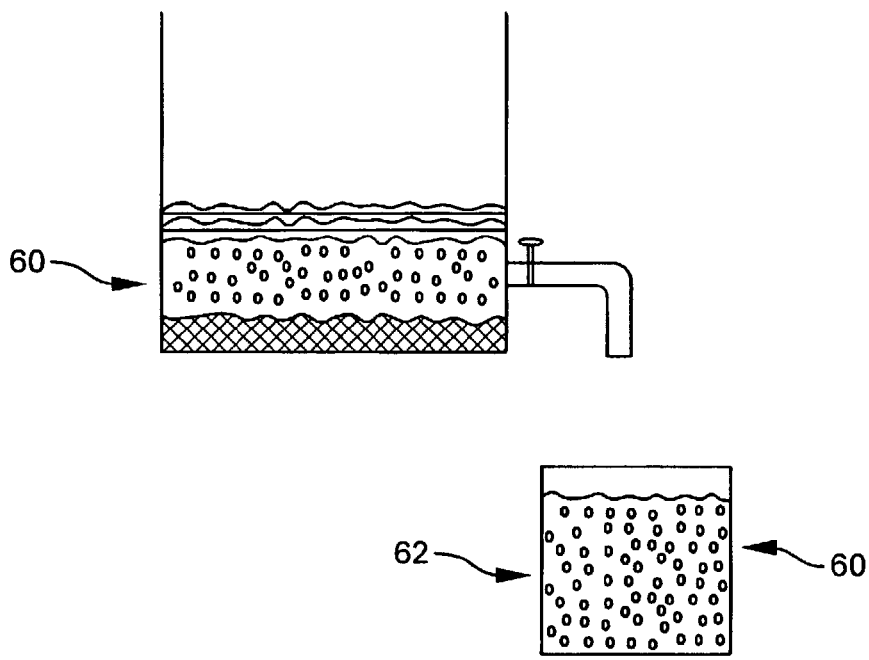
FIG. 16 is a side view of a method in accordance with the invention.

Providing soot particles 62 preferably includes collecting fused silica soot particles as a byproduct from a chemical vapor deposition glass making process. In a preferred embodiment collecting includes collecting high purity fused silica soot particles as an exhausted byproduct form a direct deposition high purity fused silica glass making process where the soot has evaded being deposited in the glass making process as intended and been exhausted as a particulate emission. In an alternative embodiment collecting includes collecting Ti doped fused silica glass soot particles as a byproduct from an ultra low expansion glass making process. In a further embodiment collecting soot 62 includes collecting the soot as a byproduct from an optical waveguide glass making process, preferably as a doped silica glass soot or as an undoped fused silica soot. Collecting soot 62 as a byproduct from a chemical vapor deposition glass making process preferably includes sedimentation/floatation separating the byproduct soot particles 62 form a glass making process contaminant. Such a slurry making process is shown in FIGS. 14-16. As shown in FIG. 14, chemical vapor deposition glass making process byproduct soot particles 62 are dispersed into a purified water pre-slurry solvent 61 contained in a sedimentation/floatation separation vessel to form a slurry 60. The dispersed slurry mixture is allowed to settle rest such that floating contaminants 80 collect near the top and sedimentary contaminants 80 collect near the bottom with the slurry of soot byproduct soot 62 in between as shown in FIG. 15. Slurry 60 of soot 62 is selectively removed and separated from the above and below glass making process contaminants.

Providing soot particles 62 includes providing a conversion site, maintaining the conversion site at a temperature above 1600° C., producing a conversion site flame, introducing a silicon feedstock compound into the conversion site flame, generating a plurality of high purity silica pre-soot intermediates, keeping the pre-soot silica intermediates under prolonged residence times at the temperature above 1600° C., and growing and sintering the pre-soot silica intermediates simultaneously into fused silica soot spheres before collecting the soot particles.

The invention includes the semi-conductor processing chemical-mechanical planarizing slurry 60 with the particulate abrasive colloidal solid sphere fused silica soot particle 62. The semi-conductor process chemical-mechanical planarizing slurry of the invention includes a plurality of particulate abrasive agent colloidal solid sphere fused silica soot particles dispersed in a semi-conductor processing chemical-mechanical slurry solvent with the particulate abrasive agent colloidal silica solid sphere soot particles including non-agglomerated solid sphere fused silica soot particles with a particle surface area no greater than about 50 m²/gram. In a preferred embodiment the soot particles are doped fused silica glass soot particles. In an alternative embodiment the soot particles are high purity fused silica soot particles. In a further preferred embodiment the solid sphere fused silica soot particles have a particle size distribution between 30 nm and 600 nm. In a preferred embodiment the soot particles have a particle surface area no greater than 20 m²/gram.

Planarizing slurry 60 of the invention with soot particles 62 has a stabilized dispersion viscosity. Preferably the soot of the inventive slurry has a surface activity $\geq 1.5 \times 10^{-5}$ moles/meter. In a preferred embodiment the planarizing slurry 60 is comprised of soot particles which have an intrinsic $pK_{a1}$ of 0.0±0.2 and intrinsic $pK_{a2}$ of 7.0±0.1. In this embodiment the soot particles preferably have an isoelectric point of 3.5±0.1. In a alternative embodiment soot particles 62 have intrinsic $pK_{a1}$ of 0.0±0.1 and intrinsic $pK_{a2}$ of 5.0±0.2. In this embodiment the soot particles preferably have an isoelectric point of 2.5±0.1. In an embodiment of the invention the soot particles are coated with cerium, iron, zirconium, aluminum, or oxides formed thereof. In a preferred embodiment of the slurry soot 62 is a Ti doped fused silica glass soot with an increased insolution charge. Preferably the Ti doped fused silica glass soot has an increased low pH stability insolution at pH values less than 5.0. The planarizing slurry 60 has an insolution stability with soot particles 62 being agglomeration resistant, gellation resistant, wherein the slurry has the stabilized viscosity.

Surface charge of soot particles 62 contributes to the beneficial planarizing properties of slurry 60. Unlike monomeric silica acid with a pKa of 9.8, glass surfaces can have variable pKa values as determined by extent of Si—O—Si bonding, composition, and structure. The surface charge, point of zero charge, and pKa's for high purity fused $SiO_2$ soot 62 and $TiO_2$—$SiO_2$ (~7 weight % $TiO_2$) soot 62 glasses is explained herein. Preferably, soot particles 62 are byproduct soot and have the same inherent physical and chemical properties as the parent glasses produced by the glass making process, since they are made in the same chemical vapor flame hydrolysis deposition process. Titration experiments performed in $10^{-1}$ to $10^{-5}$ M NaCl solutions revealed dissociation constants (i.e., intrinsic $pK_{a1}$ and $pK_{a2}$ values) of 0.0±0.2 and 7.0±0.1 respectively for the fused $SiO_2$ particles, and 0.0±0.1 and 5.0±0.2 respectively for the $TiO_2$—$SiO_2$ particles. Points of zero charge for each material were calculated as 3.5±0.1 and 2.5±0.1 for the fused $SiO_2$ and $TiO_2$—$SiO_2$ particles respectively. The role of the $TiO_2$ dopant in lowering point of zero charge and $pK_{a2}$ values is believed to be the result of four-fold.

Surface chemistry of silica particles in aqueous systems, especially surface charge and reactivity, relate to the utility of the particles in planarizing applications. Surface chemistry is greatly affected by the method of particle preparation.

Colloidal Soot Particles

Figure 17A:
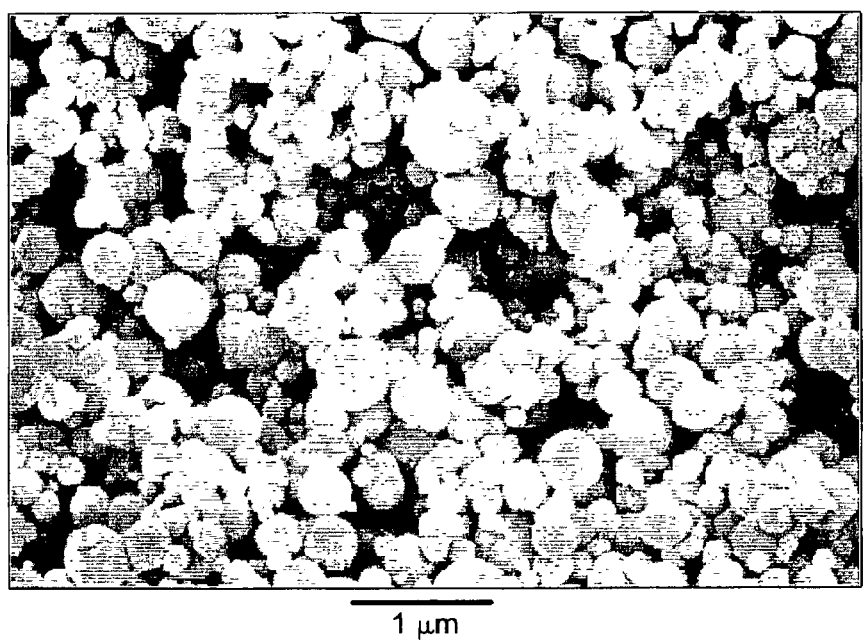
FIG. 17 (a-b) are scanning electron micrographs of (a) fused $SiO_2$ soot particles and (b) $TiO_2$—$SiO_2$ soot particles in accordance with the invention.
Figure 17B:
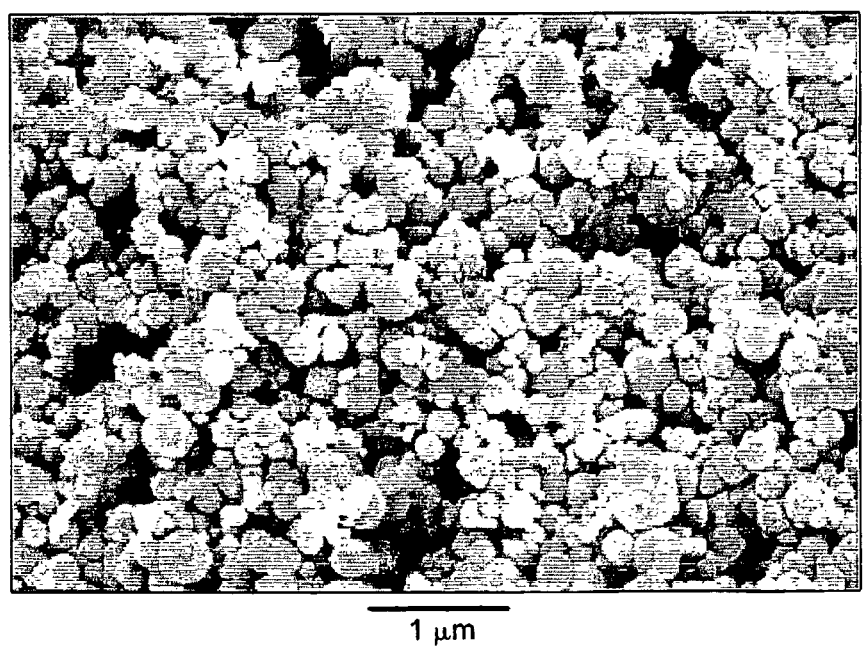

Soot particles 62 represent glass in colloidal form. As can be seen in FIG. 17, soot particles are fully dense with smooth surfaces. FIG. 17(a) is a scanning electron micrograph of high purity fused silica soot and FIG. 17(b) is a scanning electron micrograph of Ti doped silica ($TiO_2$—$SiO_2$) soot particles.

Oxide Chemistry in Aqueous Systems

Like other oxide surfaces in aqueous solutions, the silica soot 62 surface is OH terminated, amphoteric, and has a pH dependent surface charge. Surface charge and acidity of oxides are usually measured using acid-base titration of suspended oxide particles in aqueous suspensions.

Oxide surface can acquire either a positive or negative charge by association or dissociation of protons, e.g. for silica:

$\equiv$Si—OH+H⁺ $\longleftrightarrow$ $\equiv$Si—OH₂⁺ (1)

$\equiv$Si—OH $\longleftrightarrow$ $\equiv$Si—O⁻+H⁺ (2)

The acid-base behavior of an oxide surface is typically described by acidity constants $pK_{a1}$ and $pK_{a2}$, defined as:

$$K_{a1} = \frac{\{Si-OH\}[H^+]}{\{Si-OH_2^+\}} \quad (3)$$

$$K_{a2} = \frac{\{Si-O^-\}[H^+]}{\{Si-OH\}} \quad (4)$$

where { } denotes concentrations of surface species (mol/kg of adsorbing solid) and [ ] denotes the concentration of solute (M). Units for $K_{a1}$ and $K_{a2}$ are in moles per liter. The pH at which $\{Si-O^-\}=\{Si-OH^{2+}\}$ is known as the point of zero charge (i.e., $pH_{PZC}$) or isoelectric point if measured by electrophoresis. The $pH_{PZC}$ of either crystalline or amorphous $SiO_2$ ranges between 1 and 3, and the $pH_{PZC}$ of crystalline $TiO_2$ is between 3.5-5.5.

An acid-base titration method requires surface OH group concentration to be greater than approximately 0.1 mmol/L. Thus such method can be used with high surface area oxide powders but it cannot be used to titrate the surface of the glass. It is important to note that surface silanol ($\equiv$Si—OH) groups differ in acidity and that titration averages over all the sites.

The acidity of the silanol groups is dependent on the degree of condensation of silica. Monomeric silicic acid ($pK_{a2}$=9.8) has four —OH group coordination to Si, while a surface silanol group most commonly has Si coordinated by three —O—Si groups. The electronegativity of —O—Si groups is much greater than that of —OH. Therefore, the more OH groups of Si(OH)₄ are replaced by O—Si groups the more acidic the silanol group becomes. A surface silanol group is expected to be more acidic than silanol group of monomeric silicic acid because the surface silanol group is likely to have three —O—Si groups bonded to silicon rather than three OH groups that are coordinate to a silanol in monomeric silicic acid. Consequently, the $pK_{a2}$ of a soot surface is expected to be lower than the $pK_{a2}$ of monomeric silicic acid. Supporting this are acid-base titration results from Schindler and Kamber (Helvetica Chim Acta 51 (1968) 1781) that show the dissociation constant ($pK_{a2}$) for the surface silanol groups of a silica gel (fumed silica) to be 6.8±0.2.

The flame hydrolysis deposition (FHD) process used to manufacture fused $SiO_2$ (Corning® HPFS® high purity fused silica glass) and the $TiO_2$—$SiO_2$ glass (Corning® ULE® ultra-low expansion glass) (Corning Codes 7980 and 7972 respectively) (Corning Incorporated, Corning, N.Y.) generates amorphous soot particles that are sintered into a boule (see FIG. 17 for electron micrographs of each powder of soot that was not deposited and exhausted as a byproduct). Soot particles 62 have the same composition and inherent physical and chemical properties as the glass to which they are sintered into. Compositions and properties for the $SiO_2$ and $TiO_2$—$SiO_2$ soots 62 are shown in Table I, along with the properties of the glasses made by consolidating the soots in the flame hydrolysis deposition. Both soot materials are of very high purity (>99.9%) (<0.1% contaminants) as determined via spectrographic and direct coupled plasma (DCP) analysis, and have similar surface areas. X-ray diffraction analysis on both soot powders did not detect any crystalline phases.

Total number of active surface OH sites of the two soots was measure using the fluoride adsorption method of Sigg and Stumm (Colloids and Surfaces, 2 (1980) 101). The soot 62 samples were dispersed into 0.12 M NaF solution at 10% solids loading. Solutions were adjusted with dilute HCl to pH 5.5±0.1, stirred at room temperature for 1 h, and placed into an oven at 50-55° C. for 1 h. The samples were then re-mixed, checked to confirm that pH had not deviated from 5.5±0.1, and fluoride content in solution was measured using a fluoride selective electrode by direct comparison to standards prepared from the initial 0.12 M NaF solution. The amount of fluoride adsorbed, which corresponds to the amount of surface active OH groups, was determined by the difference between fluoride added and fluoride left in the solution after equilibration. The correlation coefficient ($r^2$) for the sodium fluoride standards was >99.9%. Each experiment was run in duplicate.

Titration curves were generated for the $SiO_2$ and $TiO_2$—$SiO_2$ soot 62 using samples mixed to 10% solids loading in $10^{-1}$, $10^{-2}$, $10^{-3}$, $10^{-4}$, $10^{-5}$ M NaCl as background electrolyte. Each solution was first titrated to pH 7.5 using standardized 0.1 M NaOH, then immediately titrated below pH 2.0 using standardized 0.1 and 1.0 M HCl solutions, thus promoting particle dispersion by first titrating away from the isoelectric point.

Calculation of the intrinsic pKa values (i.e., dissociation constants) for each glass soot 62 powder was performed using the titration data, information on solids loading and surface activity, and by using the surface charge data for each of the glasses. The mean surface charge (Q) defined as the portion of the surface charge due strictly to [$OH^-$] and [$H^+$], was calculated for each solution in terms of surface species per gram (mol/g):

$$Q = \frac{C_a - C_b + [OH^-] - [H^+]}{a} \quad (5)$$

$C_a$ and $C_b$ correspond to the concentrations of acid and base used during titration respectively (mol/L), [ ] represent the concentrations of solute per unit volume (mol/L), and a is the quantity of oxide in solution (g/L). With the surface charge values (Q) and those values reported earlier for surface activities (S), $pK_a$ values were calculated for each titration curve using equations (6) and (7):

$$pK_{a1} = \frac{(S-Q) \cdot [H^+]}{Q} \text{ for pH} < pH_{PZC} \quad (6)$$

$$pK_{a2} = \frac{Q \cdot [H^+]}{(S-Q)} \text{ for pH} > pH_{PZC} \quad (7)$$

From the plot of $pK_{a1}$ and $pK_{a2}$ vs. surface charge (Q), the intrinsic $pK_a$ values were determined by extrapolating to zero surface charge.

Silicon-29 magic angle spinning (MAS) nuclear magnetic resonance (NMR) was performed on soot particles and on glasses made by direct deposition consolidation of each soot. Spectra were recorded at 99.28 MHz (11.7 Tesla), with 4 μsec pulses using spinning rates of 5.0 kHz. Due to differences in relaxation times of the $^{29}Si$ spins caused by higher OH content of the soot, recycle delays of 5000 and 300 sec were used for the glasses and soots, respectively. Spectra were referenced relative to external tetramethylsilane. $^1H$—$^{29}Si$ cross-polarization (CP)/MAS NMR experiments were acquired only on soot samples using a contact time of 4.0 ms, recycle time of 10 s, and spinning rates of 3.33 kHz. Approximately 8000 scans were acquired for each spectrum.

Surface Activities

Results for total number of surface active silanol groups {Si—OH} determined by fluoride adsorption for each soot powder are shown in Table II. For the $SiO_2$ soot 62 the total number of surface active silanol groups was $4.2 \times 10^{-4}$ mol/g. The $TiO_2$—$SiO_2$ soot 62 had a higher number of surface active sites per gram ($5.0 \times 10^{-4}$ mol/g), where those sites may correspond to both Si—OH and Ti—OH surface groups. However, to relate surface activities to the inherent chemistry of each material, differences in surface areas between the two soot particles (Table I) were accounted for by converting surface activities into units of mol/m$^2$, for which the fused $SiO_2$ soot ($3.1 \times 10^{-5}$ mol/m$^2$) had a higher surface activity than the $TiO_2$—$SiO_2$ soot ($2.8 \times 10^{-5}$ mol/m$^2$).

Titration Data

Figure 18A:
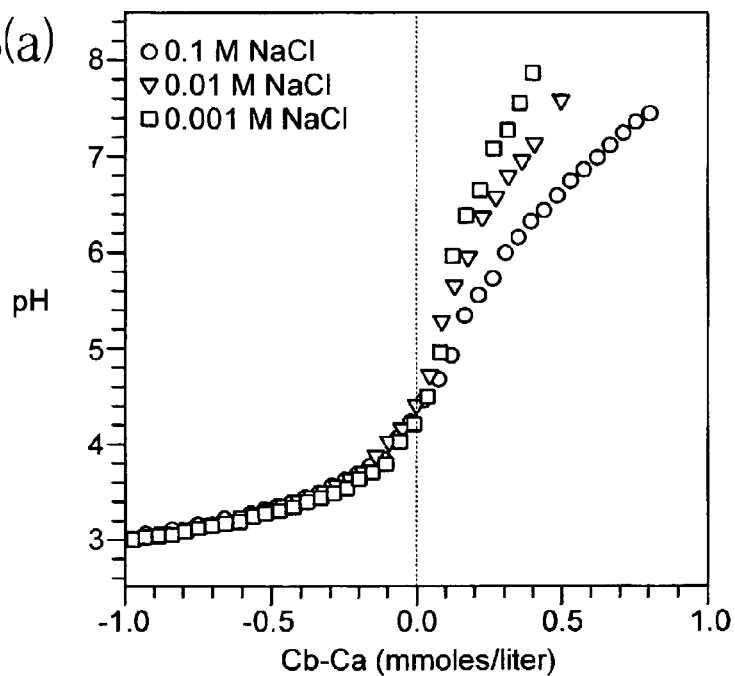
FIG. 18 (a-c) are titration results for the fused $SiO_2$ soot particles in $10^{-1}$, $10^{-2}$ and $10^{-3}$ M NaCl, plotted in terms of (a) acid-base titration, (b) surface charge calculated from titration data, and (c) acidity constants calculated from (a) and (b).
Figure 18B:
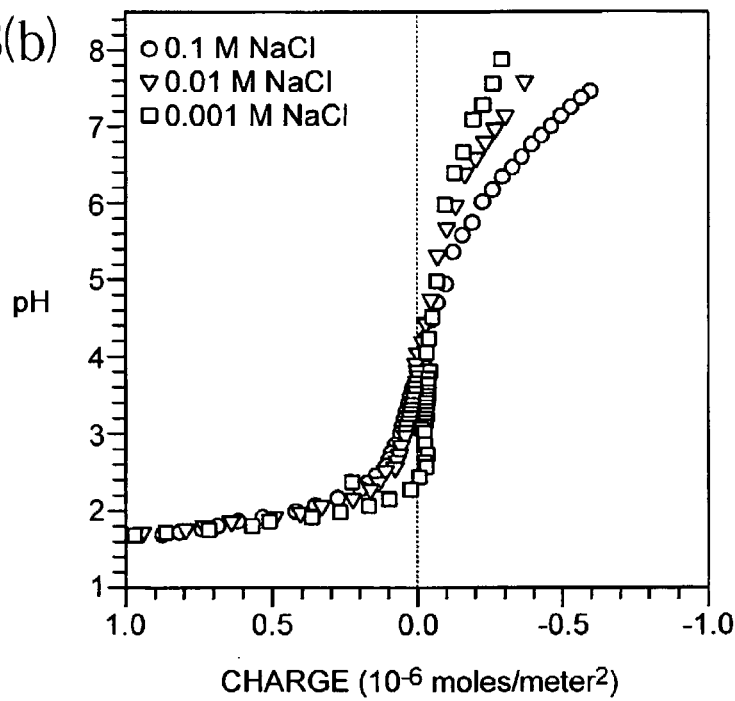
Figure 18C:
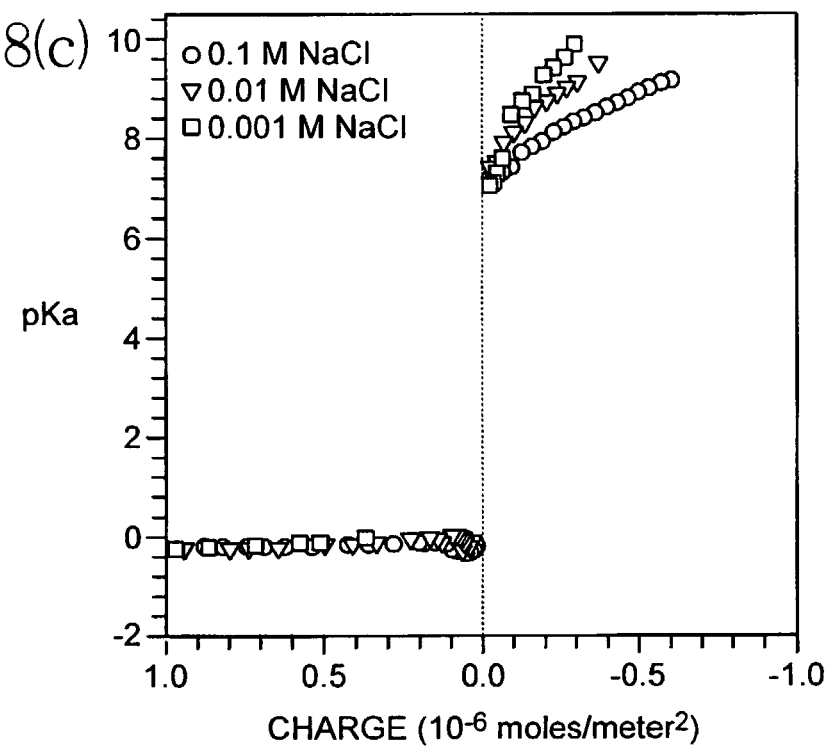
Figure 19A:
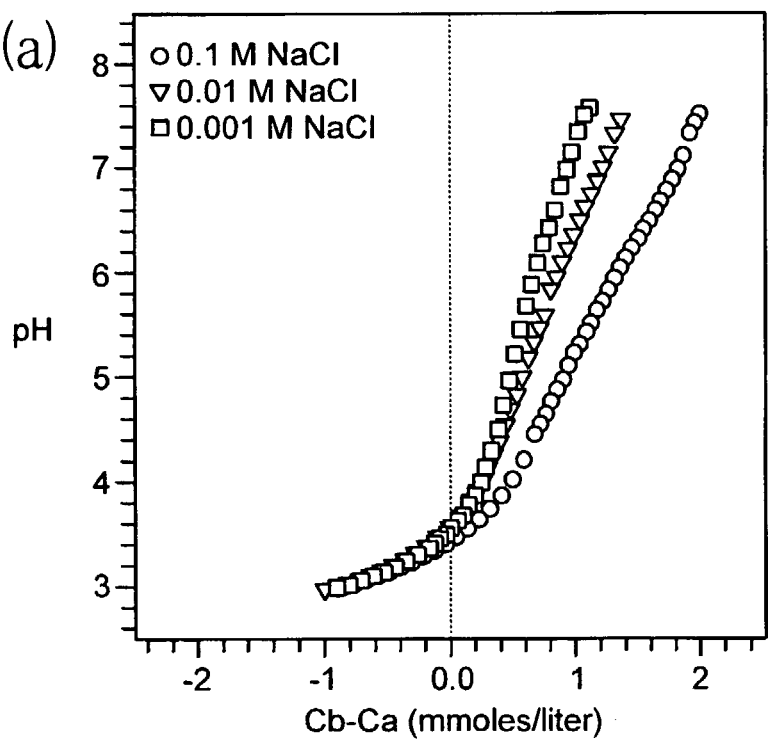
FIG. 19 (a-c) are titration results for the $TiO_2$—$SiO_2$ soot particles in $10^{-1}$, $10^{-2}$ and $10^{-3}$ M NaCl, plotted in terms of (a) acid-base titration, (b) surface charge calculated from titration data, and (c) acidity constants calculated from (a) and (b).
Figure 19B:
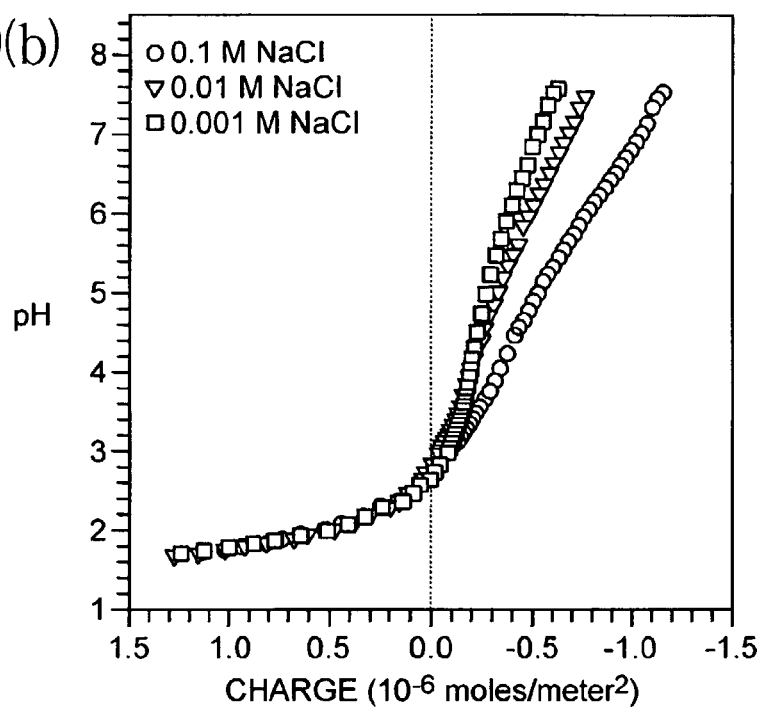

Acid-base titration curves and surface charge balanced titration plots are shown for the fused $SiO_2$ and $TiO_2$—$SiO_2$ soot 62 materials in FIG. 18 and FIG. 19, respectively. For each soot material, titration curves for different concentrations of inert electrolyte (i.e., NaCl) are shown to intersect at the point of zero charge, demonstrating the consistent behavior of both materials with respect to purity and surface charge behavior. For the fused $SiO_2$ soot (FIG. 18(b)), surface charge approached zero at pH 4.0 and remained at zero until titration below pH 3.0. This is observed when silica is titrated has been attributed to the flocculation of silica due to the lack of electrostatic stabilization caused by low surface charge. The fact that this behavior was particularly significant for the low ionic strength solutions with the fused $SiO_2$ soot (see the $10^{-3}$ M NaCl curve in FIG. 18(b)) where the surface charge is low confirms that flocculation is most likely occurring. In comparison, the $TiO_2$—$SiO_2$ soot titrated to zero charge values at pH 2.6±0.2 and did not exhibit a lag at zero charge (see FIG. 19(b)).

Surface Charge and Intrinsic pKa Values

Figure 19C:
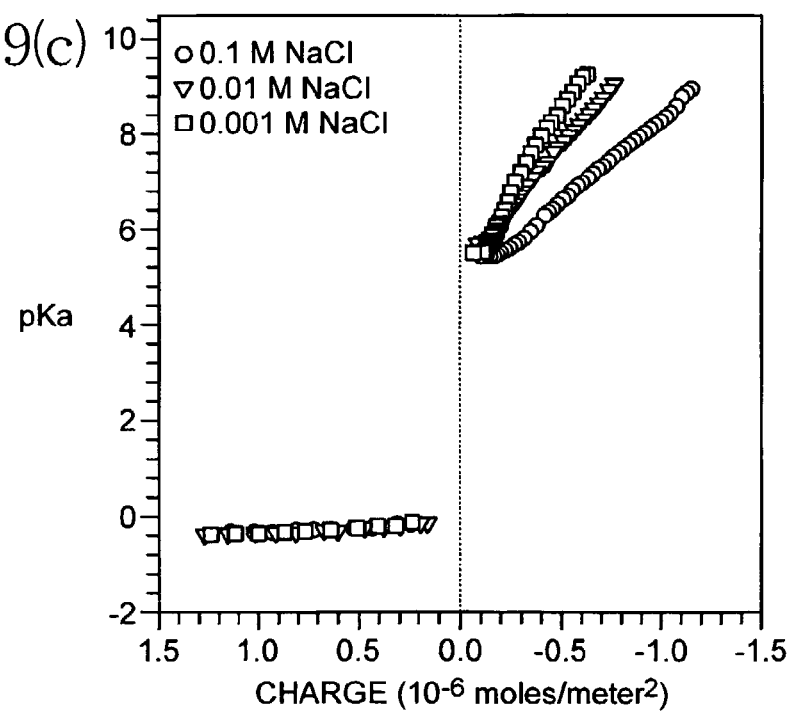
Figure 20A:
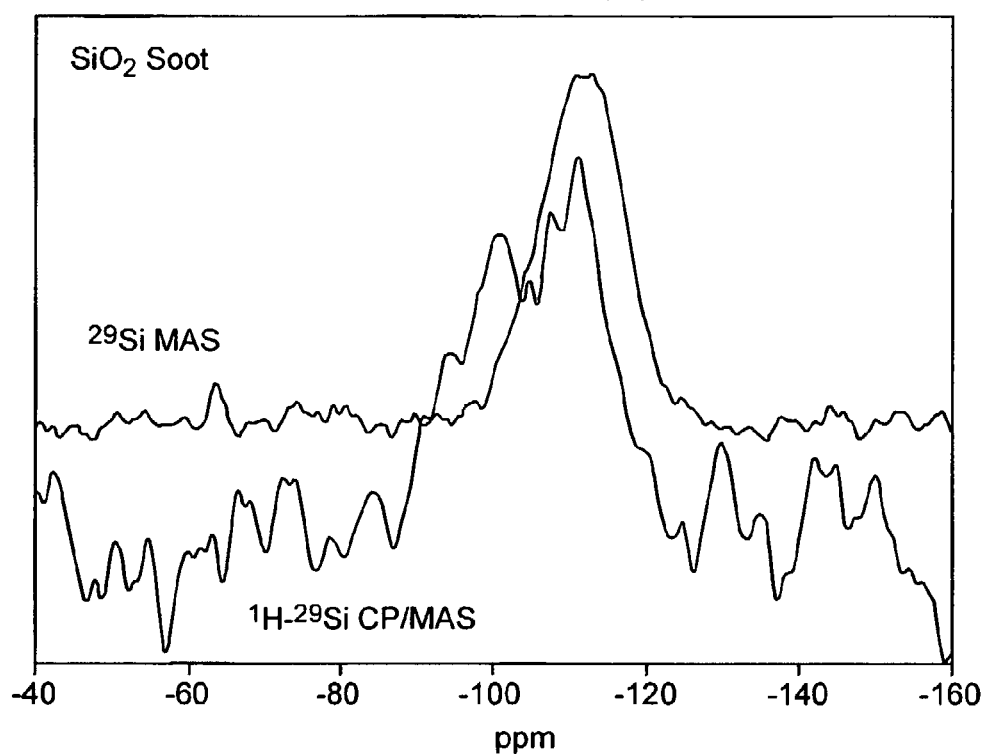
FIG. 20 (a-d) are comparison of $^{29}Si$ magic angle spinning (MAS) nuclear magnetic resonance (NMR) and $^1H$-$^{29}Si$ cross-polarization (CP)/MAS NMR results for (a) fused $SiO_2$ soot and (b) $TiO_2$—$SiO_2$ soot particles, and comparison of $^{29}Si$ MAS NMR results for the (c) fused $SiO_2$ soot particles and annealed $SiO_2$ glass and for the (d) $TiO_2$—$SiO_2$ soot particles and annealed $TiO_2$—$SiO_2$ glass.
Figure 20B:
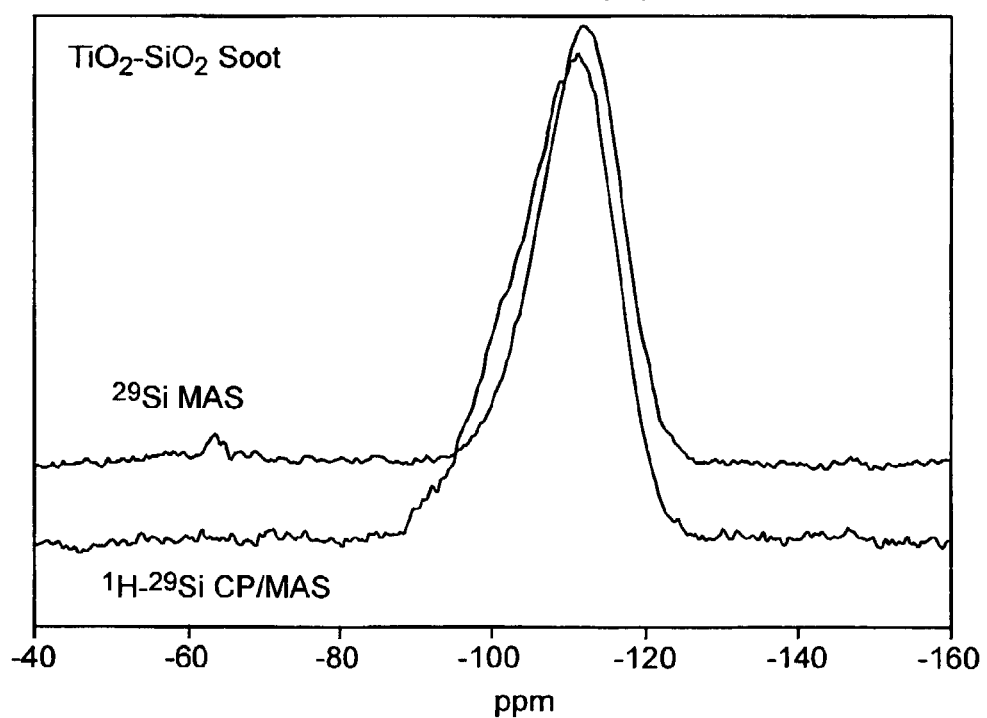
Figure 20C:
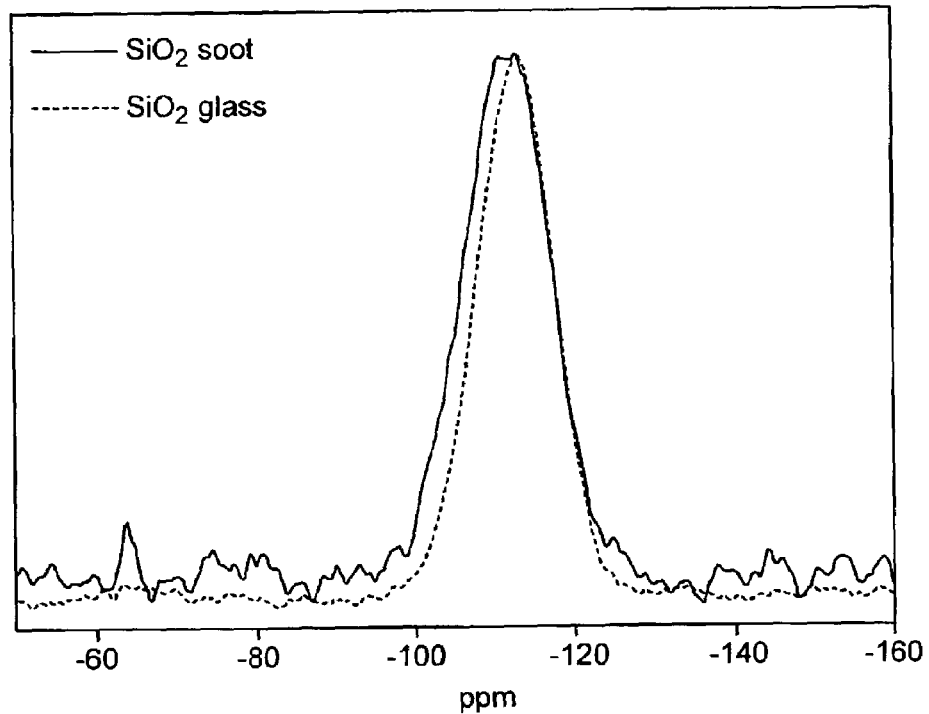
Figure 20D:
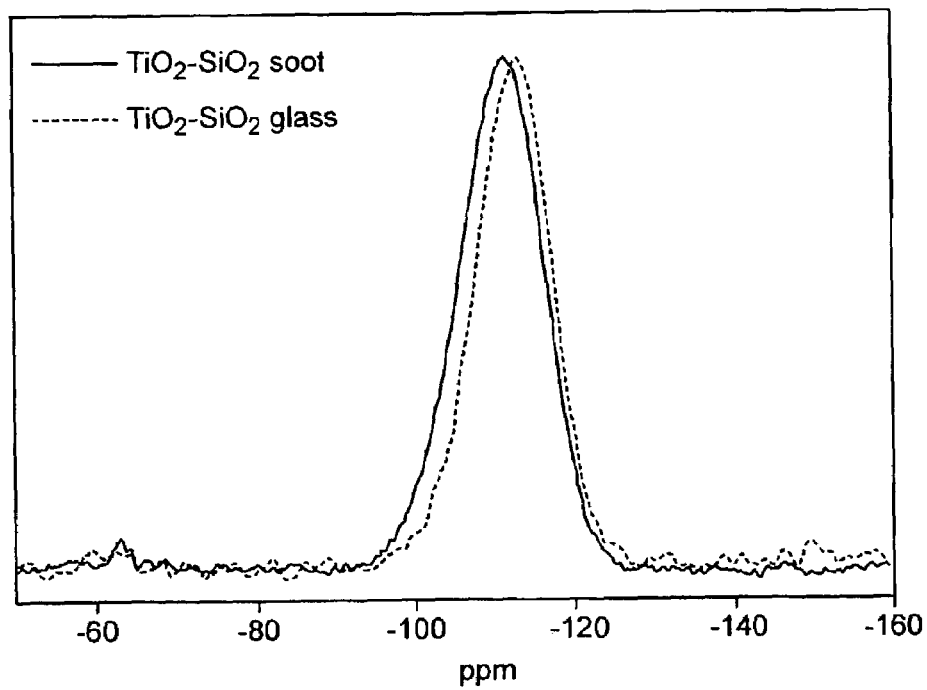

Results for the dissociation constants calculated for each soot are graphically shown in FIG. 18(c) and FIG. 19(c) and listed in Table II. The fused $SiO_2$ soot 62 was found to have intrinsic $pK_{a1}$ and $pK_{a2}$ values of 0.0±0.2 and 7.0±0.1 respectively. The $TiO_2$—$SiO_2$ soot 62 was found to have intrinsic $pK_{a1}$ and $pK_{a2}$ values of 0.0±0.1 and 5.0±0.2 respectively. The lower $pK_{a2}$ of the $TiO_2$—$SiO_2$ soot indicates that this soot is more acidic than the $SiO_2$ soot 62. The difference in NaCl concentrations over the range of $10^{-1}$ to $10^{-5}$ M did not altar results for each value, thus reflecting the consistency of each experiment.

Because of the difficulty of reading the $pH_{PZC}$ from the titration plots, especially for the $SiO_2$ soot where the surface has a charge close to zero over a wide range of pH, $pH_{PZC}$ was calculated from pKa's using the following relationship:

$$pH_{PZC} = \frac{(pK_{a1} + pK_{a2})}{2} \qquad (8)$$

As such, the $pH_{PZC}$ values for $SiO_2$ and $TiO_2$—$SiO_2$ soot particles were determined to be 3.5±0.1 and 2.5±0.1 respectively. The $TiO_2$ doping of $SiO_2$ soot increases surface acidity.

NMR

A comparison of $^{29}Si$ MAS and $^1H$—$^{29}Si$ CP/MAS spectra of the two soots 62 is presented in FIGS. 20 (a) and (b). The CP/MAS spectrum of the $TiO_2$—$SiO_2$ soot has a much higher signal-to-noise ratio than the corresponding $SiO_2$ soot spectrum. The signal in the CP/MAS spectrum is generated by direct cross-polarization from $^1H$ to $^{29}Si$, and only Si species with protons in the vicinity (such as Si—OH) give strong signal. The stronger CP/MAS signal in the $TiO_2$—$SiO_2$ soot as compared to the $SiO_2$ soot indicates that the $TiO_2$—$SiO_2$ soot has a higher OH content than the $SiO_2$ soot.

In order to determine potential variations in structure between the soot particles and glasses obtained by consolidation of the soot, $^{29}Si$ MAS-NMR spectra were also obtained for each direct deposition glass (see FIGS. 20 (c) and (d)). Both glasses have identical spectra (i.e., $TiO_2$ influence on $^{29}Si$ shift could not be resolved) with a $^{29}SiQ^4$ peak centered at −112 ppm for the $SiO_2$ glass and at −113 ppm for the $TiO_2$—$SiO_2$ glass. The $^{29}Si$ peaks for each glass are also shifted by 2 ppm upfield relative to each soot. This upfield shift could be caused by lower OH content and/or higher degree of condensation of silica in the glasses as compared to the corresponding soot particles. Since each soot was formed in a high temperature flame, each is expected to be highly condensed. However, surface area for each soot is much higher than that of each direct deposition glass, and each soot may react with atmospheric moisture to form silanol groups which shift peak positions upfield.

Effect of $TiO_2$ in $SiO_2$ Structure

Surface charge properties determined for the fused $SiO_2$ and $TiO_2$—$SiO_2$ soot materials shows that the addition of $TiO_2$ into the $SiO_2$ structure increased surface acidity and surfaces charge, while lowering the $pH_{PZC}$. A comparison of results determined in this report for the fused $SiO_2$ soot to results previously reported for a $SiO_2$ gel (P. Schindler, H. R. Kamber, Helvetica Chim Acta 51 (1968) 1781) showed equivalent values for both materials (intrinsic $pK_{a2}$ values of 7.0±0.1 and 6.8±0.2 respectively). Although no structural analysis was performed in the referenced research on the $SiO_2$ gel, analysis of the soot materials showed that the fused $SiO_2$ soot has less OH than $TiO_2$—$SiO_2$ soot. This is potentially the reason that surface charge of the $TiO_2$—$SiO_2$ soot was higher than that of $SiO_2$ soot.

The fact that $TiO_2$—$SiO_2$ soot has more acidic surface ($pKa2$=5.0, Table II) than the $SiO_2$ soot ($pKa2$=7.0, Table II) is rather unexpected. Values for $pK_{a2}$ of pure colloidal crystalline $TiO_2$ (rutile or anatase) range from 7.4 to 9.1, which is significantly higher than $pK_{a2}$ value of 6.8 reported for fumed silica (P. Schindler, H. R. Kamber, Helvetica Chim Acta 51 (1968) 1781). Because surface Ti—OH is less acidic than Si—OH, and Ti is less electronegative than Si, it would also be expected that the $pK_{a2}$ of $TiO_2$—$SiO_2$ soot should be higher than the $pK_{a2}$ of $SiO_2$ soot. Furthermore, given that the $pH_{PZC}$ of crystalline $TiO_2$ is about 2.5 pH units higher than $pH_{PZC}$ of silica, it would be expected that the addition of $TiO_2$ to $SiO_2$ should increase the isoelectric point. However, the referenced surface chemistry data are only available for 6-fold coordinated $TiO_2$ (i.e., rutile and anatase). The XRD analysis of the $TiO_2$—$SiO_2$ soot used in this study indicates that the $TiO_2$—$SiO_2$ soot is a glass (i.e., there are no crystalline $TiO_2$ phases present). It has been shown that $Ti^{4+}$ is in a tetrahedral coordination in a glass with ~7 wt. % $TiO_2$ in $SiO_2$ made by flame hydrolysis. The lower coordination state of tetrahedral Ti would increase the polarity of Ti—O bond compared to 6-coordinate Ti. However, it is unlikely that 4-fold Ti would exist on the soot surface in the aqueous system studied here because water would immediately fill the two empty coordination sites. The as-formed Ti—OH on the surface of $TiO_2$—$SiO_2$ soot would be expected to have the properties similar to Ti—OH on rutile or anatase surface, which is contrary to what is discovered here. Therefore, the orthotitanate $[TiO_4]^{4-}$ groups must be within the soot. To account for the increase in surface acidity (i.e., less electron density on the surface silanol group) of $TiO_2$—$SiO_2$ compared to $SiO_2$ soot, the orthotitanate groups must be strongly electron withdrawing. Thus it is proposed that the increased surface acidity and lower $pH_{PZC}$ of the $TiO_2$—$SiO_2$ soot compared to the pure $SiO_2$ soot is due to the tetrahedral coordination of Ti in the soot.

Potential Effects of Thermal History on Surface Properties of Glass vs. Soot

A potential difference in solubility behavior between the soot particles and the parent glasses exists due to the difference in thermal history. With recovery of the fused $SiO_2$ and $TiO_2$—$SiO_2$ soot particles 62 as a byproduct from the manufacturing process and exhausted from the furnace, the annealing cycle that the glass body boule undergoes in the furnace is not applied to the soot. Research has shown that the annealing process for E-glass lowers the rate of acid corrosion, indicating that glass surfaces become less hydroxylated during annealing. FIGS. 20 (c) and (d) demonstrate very similar degree of condensation of soot and glass, the major difference being higher $Q^3$ component in the $^{29}Si$ signal of each soot most likely due to higher OH content caused by much higher surface area of soot 62 compared to glass. The annealing process may also have decreased the OH content of each glass, resulting in a higher surface charge per unit area expected for each soot as compared to the glass surfaces. Thus, the glass surface might show higher corrosion resistance than the soot particles. However, there is no reason to suspect that structural relaxation during annealing affects surface charge results. Thus, the dissociation constants of the $SiO_2$ soot and $TiO_2$—$SiO_2$ soot materials are believed to be the same for the parent glasses, with the difference in structural relaxation and condensation affecting only the number of surface OH groups which in turn affects the surface reactivity in processes such as corrosion.

The differences between $SiO_2$ soot 62 and $TiO_2$—$SiO_2$ soot 62 in values of $pK_{a2}$ and point of zero charge ($pH_{PZC}$) indicate substantially different surface properties and reactivity of the two corresponding glasses. The greater surface acidity of the $TiO_2$—$SiO_2$ glass compared to fused $SiO_2$ glass may result in different behavior in terms of adhesion, particulate interactions during planarizing polishing, dissolution/corrosion of the glass surface and the removal of particles from surfaces during cleaning.

Titration experiments in aqueous solutions designed to measure the surface charge, acidity, and point of zero charge of $SiO_2$ and $TiO_2$—$SiO_2$ (~7 weight % $TiO_2$) soot 62

(colloidal glass made by flame hydrolysis) indicate that the two soots have different surface properties. Fused $SiO_2$ and $TiO_2$—$SiO_2$ soot particles in dilute aqueous suspension with NaCl as a background electrolyte have $pH_{PZC}$ of 3.5±0.1 and 2.5±0.1 respectively, intrinsic $pK_{a1}$ values of 0.0±0.1 and 0.0±0.2 respectively, and intrinsic $pK_{a2}$ values of 7.0±0.1 and 5.0±0.2 respectively. The difference in point of zero charge and intrinsic pKa values shows that the addition of $TiO_2$ influences the surface charge behavior of $SiO_2$, an effect which is believed to be due to 4-fold coordination of the $TiO_2$ in the $TiO_2$—$SiO_2$ structure. A 2 ppm downfield shift of the $Q^4$ silicon in the $^{29}Si$ MAS NMR spectra for each of the soot particles was found relative to the corresponding glasses. Because the surface area of soot is much greater than that of glass, a slightly higher $Q^3$ component in the soot relative to glass is most likely due to greater proportion of surface silanol groups. Since the degree of condensation in each soot and glass is similar, the data obtained on soot surfaces is believed to be useful in understanding the surface properties of each glass in aqueous systems.

TABLE I

Physical and chemical properties for the fused $SiO_2$ and $TiO_2$—$SiO_2$ glasses and corresponding soot particles. The parent glass codes are Corning 7980 and 7972 respectively.

| Property | Fused $SiO_2$ | $TiO_2$—$SiO_2$ |
|---|---|---|
| Composition (weight %) | | |
| Silica | 100% | 93% |
| Titania | 0% | 7% |
| Bulk Properties | | |
| Density (g/cc) | 2.20 | 2.21 |
| Elastic Modulus (GPa) | 73 | 68 |
| Knoops Hardness ($HK_{100}$) | 498 | 460 |
| Thermal Expansion, 0-300° C. ($\times 10^{-7}/°$ C.) | 5.6 | 0.5 |
| Particulate Properties | | |
| Surface Area ($m^2/g$) | 13.4 | 17.7 |

TABLE II

Surface properties determined via fluoride adsorption and acid-base titration for fused $SiO_2$ and $TiO_2$—$SiO_2$ soot particles.

| Property | Fused $SiO_2$ | $TiO_2$—$SiO_2$ glass |
|---|---|---|
| Surface Activity | | |
| (moles/gram) | $4.2 \times 10^{-4}$ | $5.0 \times 10^{-4}$ |
| (moles/meter$^2$) | $3.1 \times 10^{-5}$ | $2.8 \times 10^{-5}$ |
| Intrinsic $pK_{a1}$ | 0.0 ± 0.2 | 0.0 ± 0.1 |
| Intrinsic $pK_{a2}$ | 7.0 ± 0.1 | 5.0 ± 0.2 |
| Isoelectric Point ($pH_{IEP}$) | 3.5 ± 0.1 | 2.5 ± 0.1 |

Dispersion of abrasive particles in acidic environments is of specific interest to the semiconductor integrated circuit industry for chemical-mechanical planarization (CMP), where slurry formulations are adjusted to pH 2-7 for the planarization of metal interconnecting layers. Specific to $SiO_2$ abrasive particles in this pH range is the need to produce stable slurry suspensions that exhibit low viscosity without agglomeration or gellation. Synthesis of $SiO_2$ abrasive particles has typically been achieved through either sol-gel processing or flame hydrolysis to form fumed silica.

Fumed silica abrasive particles which are formed by flame hydrolysis have high surface areas (>100 $m^2$/gram). With flame hydrolysis of fumed silica particles amorphous silicon dioxide is produced by introducing volatile trichlorosilane into a hydrogen/oxygen flame. Hydrolysis at about 1200° C. produces fumed silica and hydrogen chloride. Under the reaction conditions in the flame, high viscosity $SiO_2$ primary particles of the order of about 10 nanometers ($10^{-9}$ m) are first produced. The $SiO_2$ surface of these particles is smooth and not microporous. In the flame these primary particles fuse into larger units, known as aggregates, of the order of 100 to 500 nanometers. On cooling these aggregates flocculate to form agglomerates, also called tertiary structures. Such agglomerates as WACKER HDK® fumed silica agglomerates measure between 10-50 micrometers. Fumed silica such as WACKER HDK® aggregates are open structured and therefore macroporous. The large available surface area of the fumed silica aggregates and agglomerates is responsible for fumed silica's high specific surface area (BET). (See WACKER HDK® Fumed Silica—The Product, www.wacker.del english/hdk/product_e.htm, Oct. 5, 1999). Soot 62 of the invention are produced by flame hydrolysis at high temperatures greater than 1300° C., preferably >1400° C., more preferably >1500° C. such as 1600° C., and have relatively low surface areas less than 100 $m^2$/gram. Soot 62 particles spend extended times at the high temperatures to result in solid spherical soot particles with the low surface areas.

Rheology (Viscosity) Experiments

Rheological experiments were performed for 3 and 6 weight percent $SiO_2$ slurries prepared in $10^{-3}$ M NaCl and adjusted to pH 2, 4, and 6 using dilute HCl and NaOH, using a variable speed viscometer with an ultra-low concentric cylinder adapter at 20.0±0.1° C. Shear stress and viscosity measurements were made at shear rates starting at 0.5 and increasing to 100 s$^{-1}$, followed by a hold at 100 s$^{-1}$ before decreasing down to 0.5 s$^{-1}$. In this manner, each slurry was characterized for agglomeration and gellation effects observed from the hysteresis using curve fitting software and by calculating the difference between areas under the shear stress curves for increasing and decreasing shear rates.

Results show that the inventive fused silica soot particles 62 exhibit greater slurry stability in terms of less agglomeration and/or gellation effects when mixed into a slurry 60. Soot 62 has beneficial lower surface areas, thus promoting lower concentrations of surface charges in solution where particles are mixed to identical weight percents in comparison to fumed silica particles. As a result, the soot 62 can me mixed to greater solids loading (e.g., >10 weight percent) while maintaining lower viscosity values and reflecting Newtonian behavior. Soot 62 in slurry 60 has beneficial deposited metal removal rates, preferably conductive copper removal rates.

| Soot 62 Particles Mixed In DI Water With 5 wt. % Hydrogen Peroxide + 1 wt. % Glyene | |
|---|---|
| Soot Concentration | Removal Rate (nm/min) |
| 1% | 534 |
| 3% | 523 |
| 6% | 522 |

The acidic dispersion behavior of soot particles 62 is compared herein to two fumed $SiO_2$ abrasive particle brands (Degussa and Cabot). The fused $SiO_2$ soot particles 62 have a larger particle size, broader size distribution, and lower surface area. Fluoride adsorption was used to study surface activity, and acid-base titration was used to study surface charge in $10^{-1}$ to $10^{-3}$ M NaCl solutions over the pH range of 2-7.5. Each of the three $SiO_2$ particles exhibited similar titration behavior, with the fused $SiO_2$ soot particles 62 displaying a higher intrinsic $pK_{a2}$ value of 7.0 as compared to 6.8 and 6.1 for the two fumed $SiO_2$ particles. Rheological experiments designed to test for dispersion and agglomeration/gellation at 3 and 6 weight percent solids loading in $10^{-3}$ M NaCl solutions adjusted to pH 2, 4, and 6 showed the fused $SiO_2$ soot particles 62 to be more stable in suspension, exhibiting lower viscosity results for all test conditions. Results show that the fused $SiO_2$ soot particles 62 display superior dispersion properties as compared to conventional fumed $SiO_2$ particles for semiconductor chemical-mechanical planarizing slurry applications under acidic conditions.

Figure 21A:
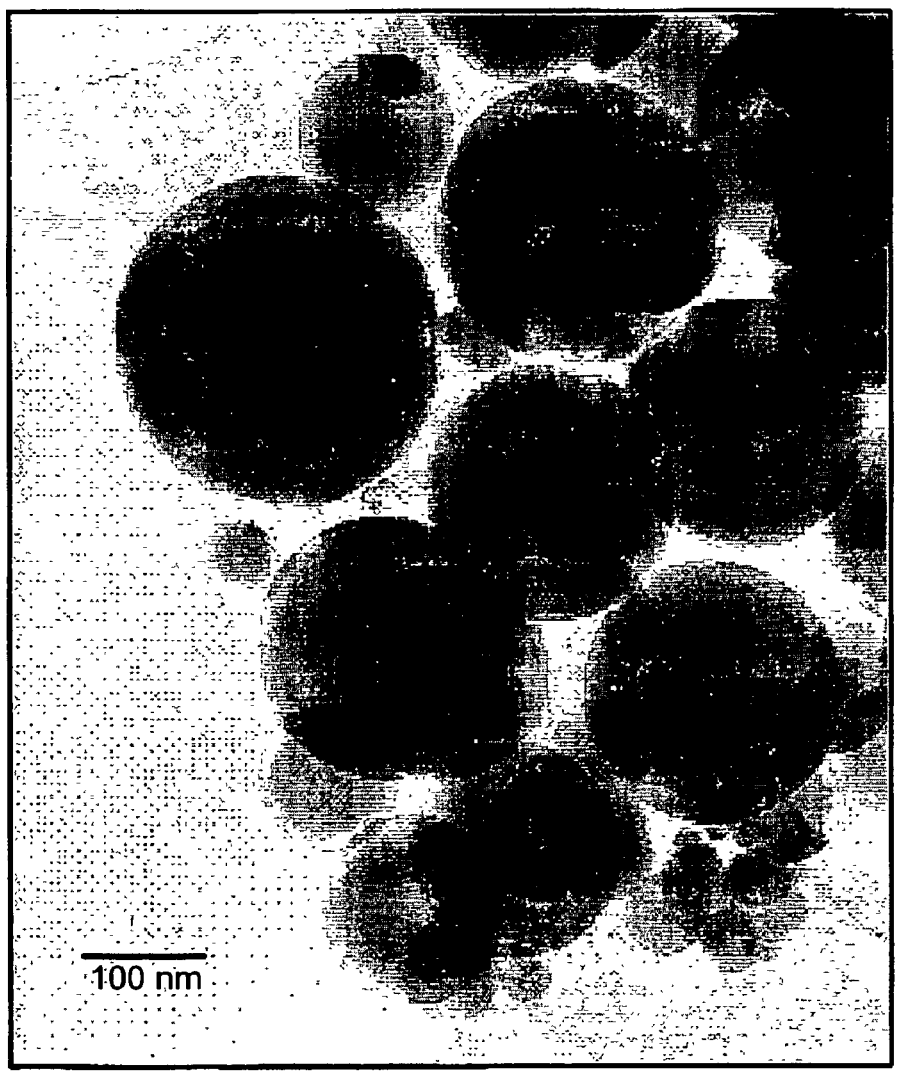
FIG. 21 (a-c) are TEM micrograph images of (a) fused silica soot (b) Degussa® brand fumed silica, and (c) Cabot® brand fumed silica.
Figure 21B:
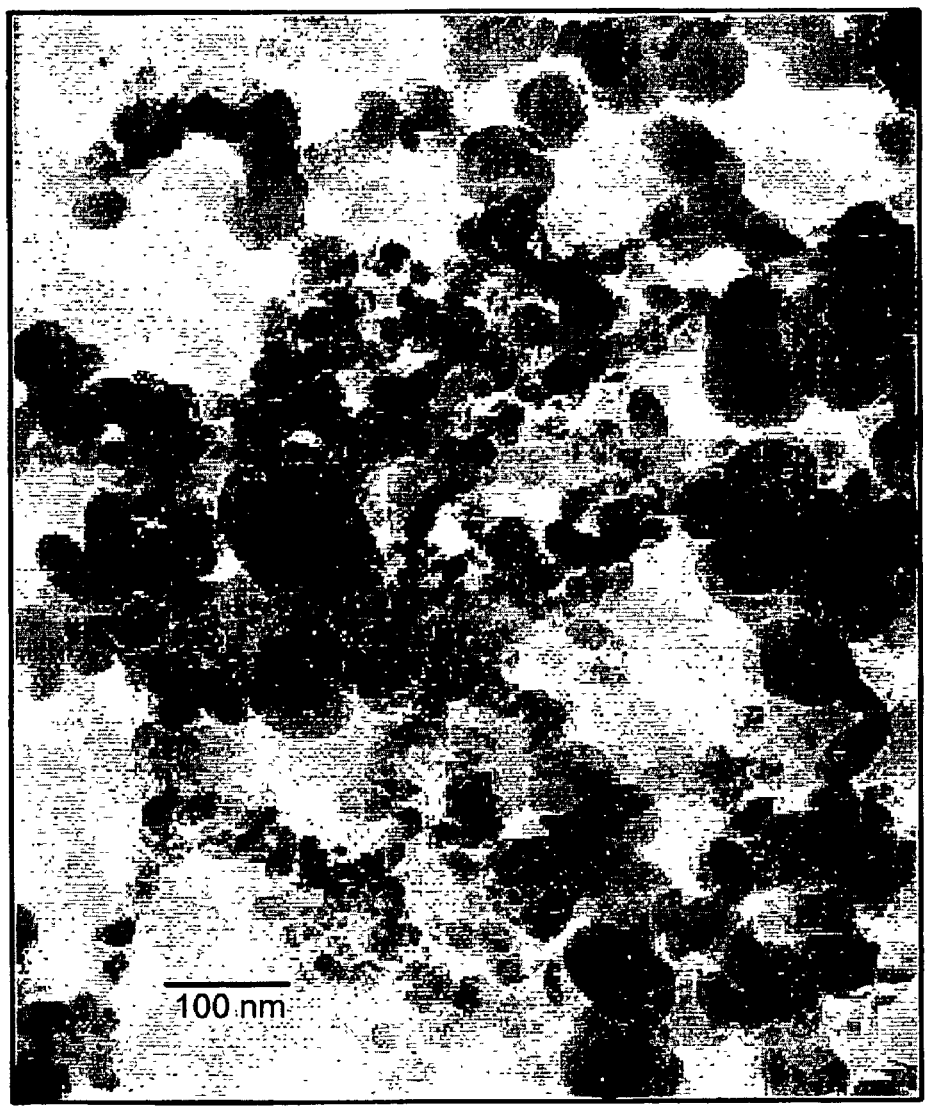
Figure 21C:
Figure 22A:
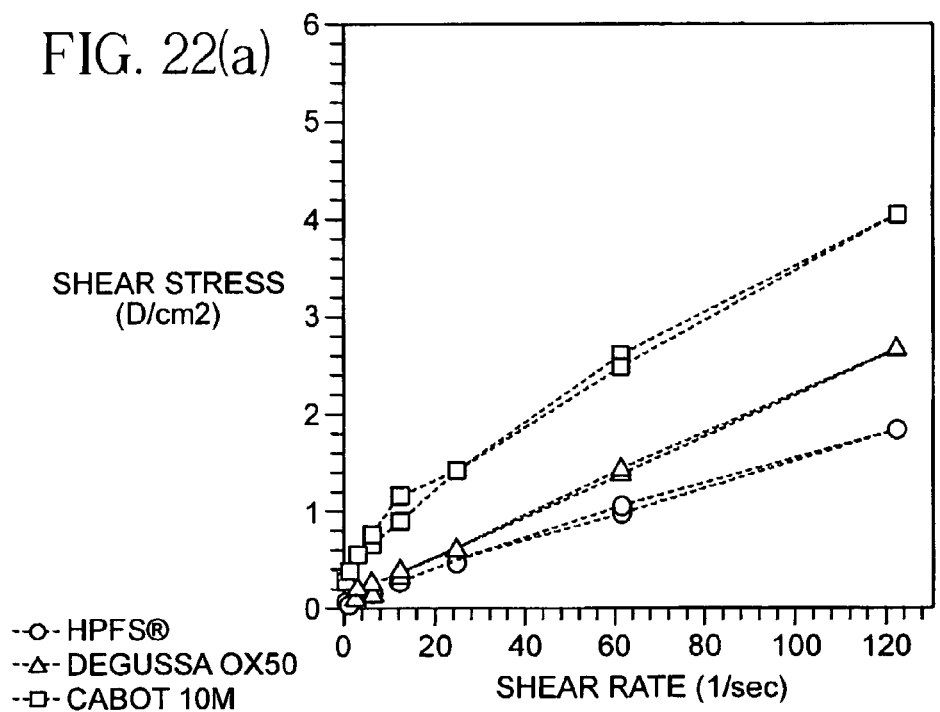
FIG. 22(a) are $10^{-3}$ M NaCl 3 weight percent solids loading slurry adjusted to pH2.
Figure 22B:
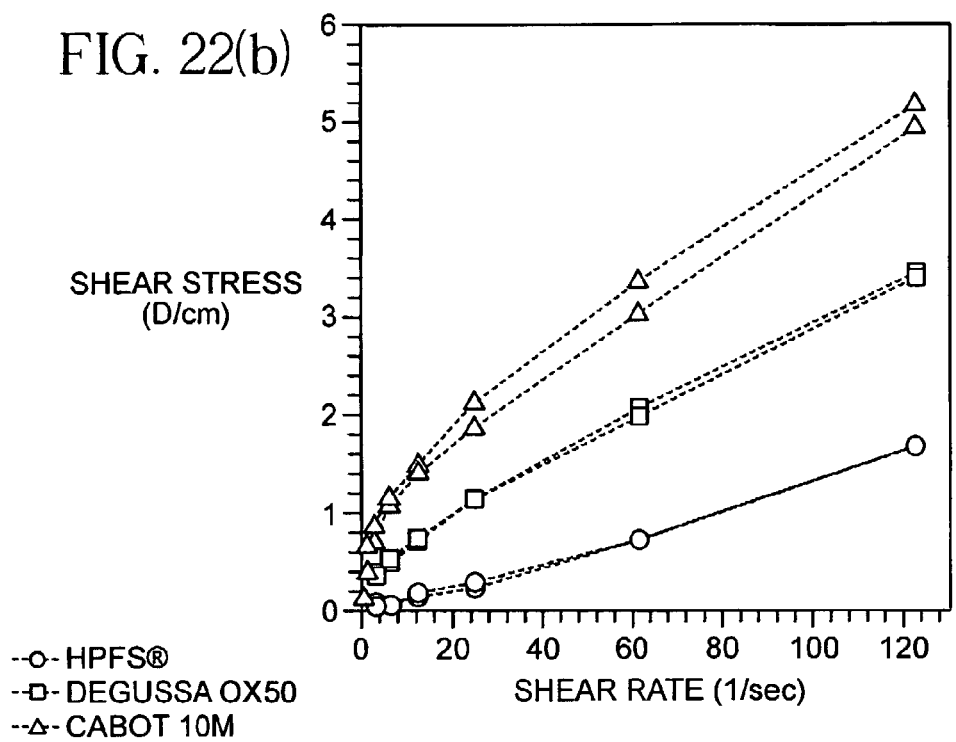
FIG. 22(b) are $10^{-3}$ M NaCl 3 weight percent solids loading slurry adjusted to pH 4.
Figure 22C:
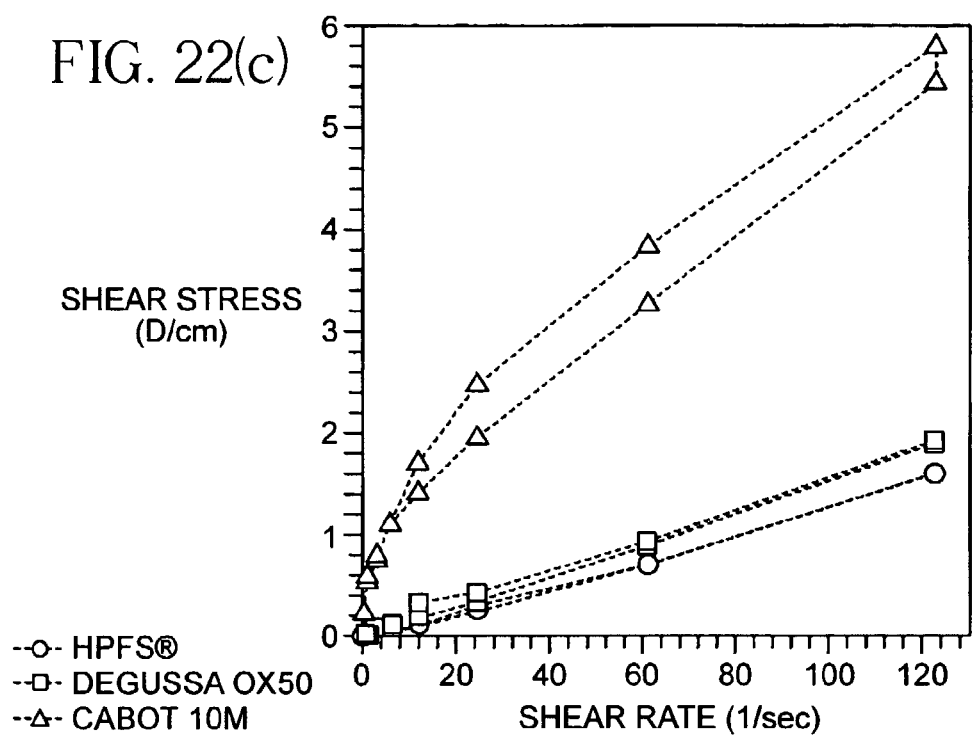
FIG. 22(c) are $10^{-3}$ M NaCl 3 weight percent solids loading slurry adjusted to pH 6.
Figure 22D:
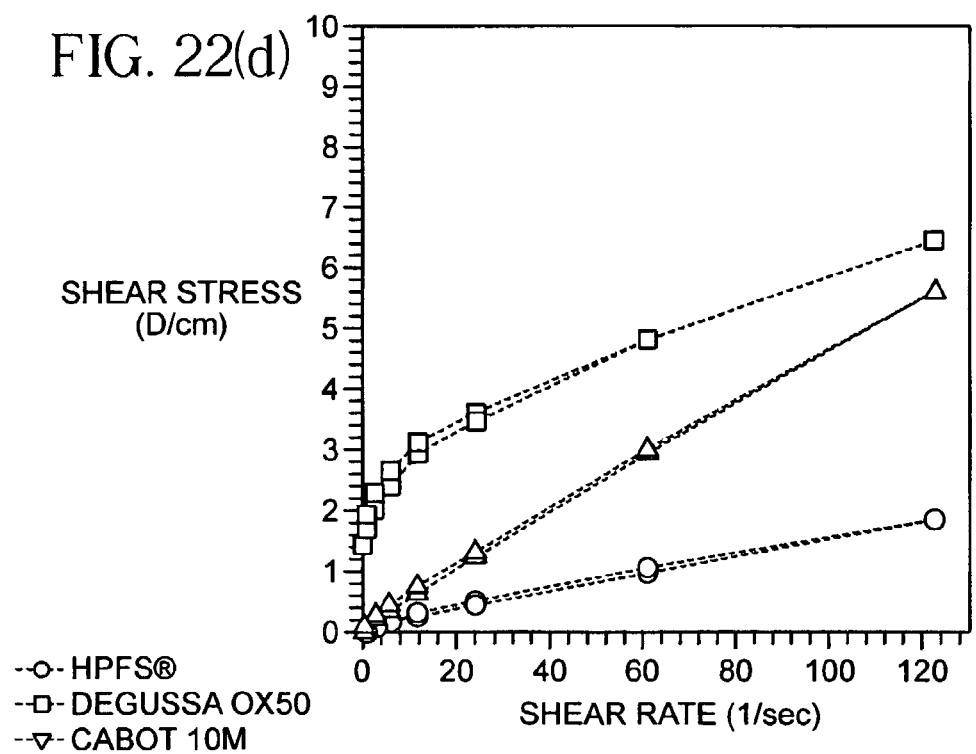
FIG. 22(d) are $10^{-3}$ NaCl 6 weight percent solids loading slurry adjusted to pH 2.
Figure 22E:
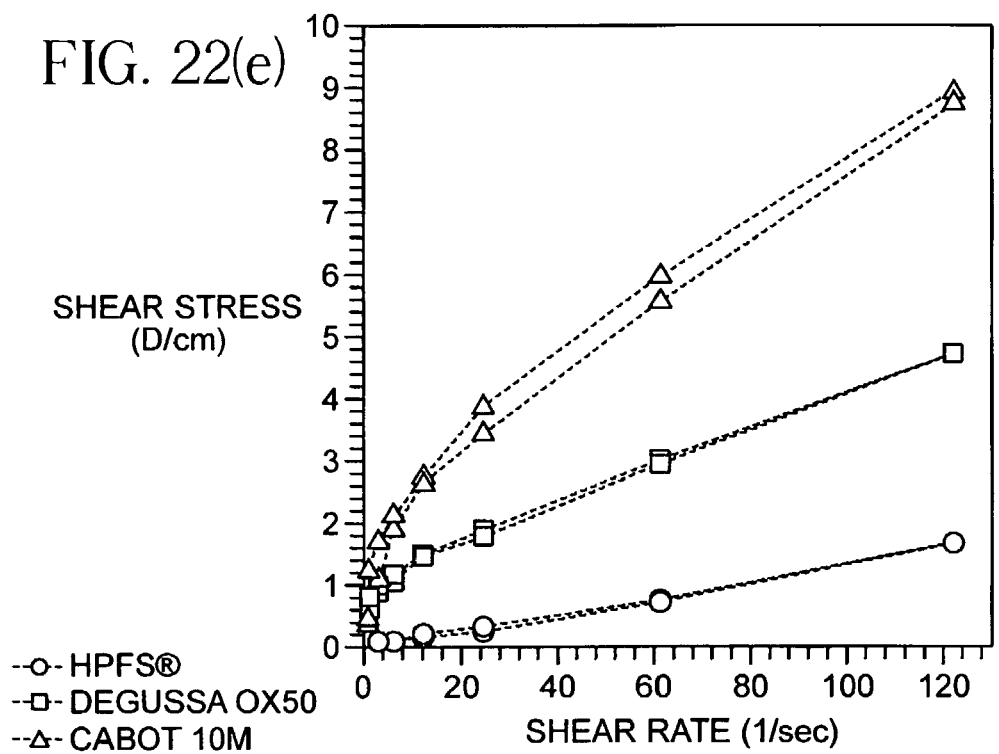
FIG. 22(e) are $10^{-3}$ NaCl 6 weight percent solids loading slurry adjusted pH 4.
Figure 22F:
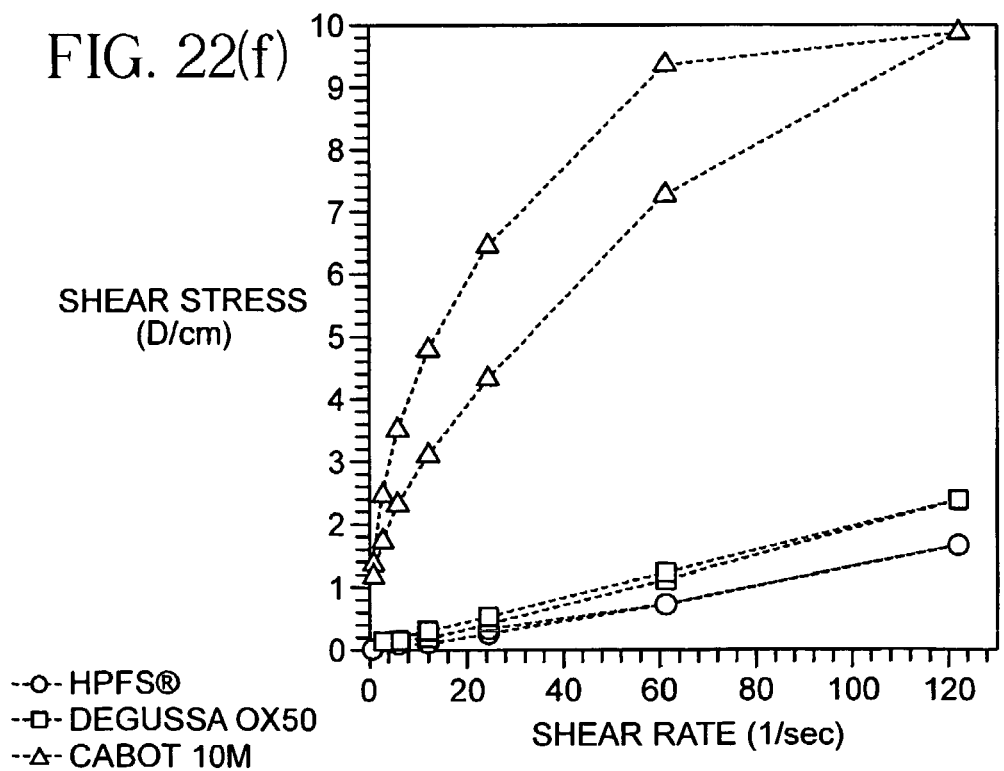
FIG. 22(f) are $10^{-3}$ NaCl 6 weight percent solids loading slurry adjusted pH 6.

FIG. 21(a) is a transmission electron micrograph of soot 62 of the invention. FIG. 21(b) is a transmission electron micrograph of fumed silica Degussa® 0x50 brand fumed $SiO_2$. FIG. 21 (c) is a transmission electron micrograph of fumed silica Cabot® 10M brand fumed $SiO_2$. A comparison of FIG. 21(a) with FIG. 21(b-c) clearly shows the distinctions between the soot 62 of the invention and fumed silica particles.

FIG. 22 (a-f) are plots of shear rate (1/sec) vs. shear stress ($D/cm^2$) of the compared silica particles in slurry. The open circle shows high purity fused silica soot in accordance with the invention. The open square designates the Degussa fumed in accordance with the invention. The open square designates the Degussa fumed silica. The open triangle designates the Cabot fumed silica. FIG. 22(a) are $10^{-3}$ M NaCl 3 weight percent solids loading slurry adjusted to pH2. FIG. 22(b) are $10^{-3}$ M NaCl 3 weight percent solids loading slurry adjusted to pH 4. FIG. 22(c) are $10^{-3}$ M NaCl 3 weight percent solids loading slurry adjusted to pH 6. FIG. 22(d) are $10^{-3}$ NaCl 6 weight percent solids loading slurry adjusted to pH 2. FIG. 22(e) are $10^{-3}$ NaCl 6 weight percent solids loading slurry adjusted pH 4. FIG. 22(f) are $10^{-3}$ NaCl 6 weight percent solids loading slurry adjusted pH 6.

Such comparison shows that the inventive colloidal fused silica soot 62 is resistant to catastrophic viscosity changes for slurries mixed to varying degrees of solids loading. For example, at 3 weight percent solids loading both soot 62 and

TABLE III

Surface properties determined by fluoride adsorption and acid-base titration of colloidal $SiO_2$ particles. Dissociation constants determined by acid-base titration of particles mixed to 150 $m^2$/100 ml in $10^{-1}$, $10^{-2}$, and $10^{-3}$ M NaCl.

| Property | HPFS ® | Degussa OX50 | Cabot 10M |
|---|---|---|---|
| Composition | 100% $SiO_2$ | 100% $SiO_2$ | 100% $SiO_2$ |
| Particle type | Fused Soot | Fumed | Fumed |
| Surface Area ($m^2$/g) | 14.79 | 53.30 | 199.67 |
| Surface Activity (×$10^{-6}$ moles/$m^2$) | 17.9 ± 1.0 | 8.7 ± 1.0 | 4.3 ± 1.0 |
| Intrinsic $pK_{a1}$ | −0.4 ± 0.2 | −0.5 ± 0.5 | −0.4 ± 0.1 |
| Intrinsic $pK_{a2}$ | 7.0 ± 0.1 | 6.8 ± 0.1 | 6.1 ± 0.1 |
| Isoelectric Point ($pH_{IEP}$) | 3.3 ± 0.2 | 3.1 ± 0.3 | 2.8 ± 0.1 |

TABLE IV

Rheological behavior of $SiO_2$ particles at 20.0 ± 0.1° C. dispersed to 3 and 6 weight percent in 0.001M NaCl at pH 2, 4, and 6. Particle codes are (A) HPFS ®fused soot $SiO_2$, (B) Degussa 0 × 50 fumed $SiO_2$, and (C) Cabot 10M fumed $SiO_2$. Shear stress and viscosity values given are for a shear rate of 122.3 l/sec. Agglomeration (positive values) and gellation (negative values) are quantified in terms of the difference in integration values from curves fitted to shear stress data for increasing and decreasing shear rate schedules (i.e., differences in area under each curve).

| Slurry Mix | $SiO_2$ Particles | Rheological Behavior | Shear Stress ($D/cm^2$) | Viscosity (cP) | Power Law Index | Agglomeration (+) or Gellation (−) |
|---|---|---|---|---|---|---|
| 3 wt % pH 2 | A | Newtonian | 1.50 | 1.83 | — | −2.8 |
| | B | Shear Thinning | 3.29 | 4.03 | −0.51 | +0.4 |
| | C | Shear Thinning | 2.17 | 2.66 | −0.09 | −4.1 |
| 3 wt % pH 4 | A | Newtonian | 1.35 | 1.65 | — | −2.4 |
| | B | Shear Thinning | 2.75 | 3.37 | −0.41 | +6.1 |
| | C | Shear Thinning | 4.03 | 4.92 | −0.54 | +33.3 |
| 3 wt % pH 6 | A | Newtonian | 1.31 | 1.61 | — | −3.1 |
| | B | Newtonian | 1.56 | 1.91 | — | −7.4 |
| | C | Shear Thinning | 4.43 | 5.42 | −0.49 | +55.7 |
| 6 wt % pH 2 | A | Newtonian | 2.78 | 2.27 | — | −2.8 |
| | B | Shear Thinning | 5.24 | 6.41 | −0.73 | +1.7 |
| | C | Shear Thinning | 4.54 | 5.55 | −0.20 | −5.7 |
| 6 wt % pH 4 | A | Newtonian | 1.31 | 1.61 | — | −0.3 |
| | B | Shear Thinning | 3.84 | 4.70 | −0.61 | +8.6 |
| | C | Shear Thinning | 7.13 | 8.72 | −0.58 | +41.4 |
| 6 wt % pH 6 | A | Newtonian | 1.31 | 1.61 | — | −3.1 |
| | B | Shear Thinning | 1.91 | 2.33 | −0.17 | −11.0 |
| | C | Shear Thinning | 8.06 | 9.86 | −0.53 | +194.6 | the commercially available fumed SiO$_2$ have similar viscosity behavior across the pH regime (pH 2-12). However and specifically at low pH values (less than 7), an increase in solids loading (e.g., from 3-6 weight percent) results in a significant increase in viscosity and agglomeration/gellation behavior for the commercially available fumed silica competition. Soot 62 reflects relatively no change under the same conditions.

It will be apparent to those skilled in the art that various modifications and variations can be made to the present invention without departing from the spirit and scope of the invention. Thus, it is intended that the present invention covers the modifications and variations of this invention provided they come within the scope of the appended claims and their equivalents.

What is claimed is:

1. A semiconductor processing method of chemical-mechanical planarizing a semiconductor device process surface, said method comprising:
providing a semiconductor integrated circuit workpiece, said semiconductor integrated circuit workpiece having a non-planarized integrated circuit workpiece surface, providing a chemical-mechanical planarizing slurry, said slurry comprised of a plurality of particulate abrasive agent colloidal silica soot;
abrading said integrated circuit workpiece surface with said colloidal silica soot to provide a planarized integrated circuit workpiece.

2. A semiconductor processing method as claimed in claim 1, wherein providing a semiconductor integrated circuit workpiece having a nonplanar integrated circuit workpiece surface includes providing a semiconductor integrated circuit workpiece with a metallized interconnection structure.

3. A method as claimed in claim 2, wherein providing a nonplanar semiconductor integrated circuit workpiece surface with a metallized interconnection structure includes providing a semiconductor integrated circuit silicon wafer with a lithographic integrated circuit pattern and depositing at least one metallization interconnection layer.

4. A semiconductor processing method as claimed in claim 1, wherein providing a semiconductor integrated circuit workpiece having a nonplanar integrated circuit workpiece surface includes providing a semiconductor integrated circuit workpiece with an interlevel dielectric structure.

5. A method as claimed in claim 4, wherein providing a nonplanar semiconductor integrated circuit workpiece surface includes depositing an interlevel dielectric.

6. A semiconductor processing method as claimed in claim 1, wherein providing said slurry having a plurality of particulate abrasive agent colloidal silica soot includes providing a plurality of soot particles with a particle size >0.25 μm.

7. A semiconductor processing method as claimed in claim 1, wherein providing said slurry having a plurality of particulate abrasive agent colloidal silica soot includes providing a plurality of soot particles with a particle size distribution between 30 nm and 600 nm.

8. A semiconductor processing method as claimed in claim 1, wherein providing said slurry having a plurality of particulate abrasive agent colloidal silica soot includes providing spherical soot particles.

9. A semiconductor processing method as claimed in claim 1, wherein providing said slurry having a plurality of particulate abrasive agent colloidal silica soot includes providing a plurality of non-agglomerated solid sphere fused silica soot particles with a particle size distribution between 30 nm and 600 nm.

10. A semiconductor processing method as claimed in claim 1, wherein providing said slurry having a plurality of particulate abrasive agent colloidal silica soot includes providing high purity fused silica soot particles.

11. A semiconductor processing method as claimed in claim 1, wherein providing said slurry having a plurality of particulate abrasive agent colloidal silica soot includes providing doped fused silica glass soot particles.

12. A semiconductor processing method as claimed in claim 1, wherein providing said slurry having a plurality of particulate abrasive agent colloidal silica soot includes providing Ti doped fused silica glass soot particles.

13. A semiconductor processing method as claimed in claim 1, wherein providing said slurry having a plurality of particulate abrasive agent colloidal silica soot includes providing Ge doped fused silica glass soot particles.

14. A semiconductor processing method as claimed in claim 1, wherein providing said slurry having a plurality of particulate abrasive agent colloidal silica soot includes providing Al doped fused silica glass soot particles.

15. A semiconductor processing method as claimed in claim 1, wherein providing said slurry having a plurality of particulate abrasive agent colloidal silica soot includes providing B doped fused silica glass soot particles.

16. A semiconductor processing method as claimed in claim 1, wherein providing said slurry having a plurality of particulate abrasive agent colloidal silica soot includes providing P doped fused silica glass soot particles.

17. A semiconductor processing method as claimed in claim 1, wherein providing said slurry having a plurality of particulate abrasive agent colloidal silica soot includes providing Zr doped fused silica glass soot particles.

18. A semiconductor processing method as claimed in claim 1, wherein providing said slurry having a plurality of particulate abrasive agent colloidal silica soot includes providing Er doped fused silica glass soot particles.

19. A semiconductor processing method as claimed in claim 1, wherein providing said slurry having a plurality of particulate abrasive agent colloidal silica soot includes providing Ce doped fused silica glass soot particles.

20. A semiconductor processing method as claimed in claim 1, wherein providing said slurry having a plurality of particulate abrasive agent colloidal silica soot includes providing periodic table of elements lanthanide series metal doped fused silica glass soot particles.

21. A semiconductor processing method as claimed in claim 1, wherein providing said slurry having a plurality of particulate abrasive agent colloidal silica soot includes providing soot particles having a mean particle size in the range of 0.3 to 0.5 μm.

22. A semiconductor processing method as claimed in claim 1, wherein providing said slurry having a plurality of particulate abrasive agent colloidal silica soot includes providing soot particles having a particle surface area less than 100 m$^2$/gram.

23. A semiconductor processing method as claimed in claim 1, wherein providing said slurry having a plurality of particulate abrasive agent colloidal silica soot includes providing soot particles having a particle surface area no greater than 50 m$^2$/gram.

24. A semiconductor processing method as claimed in claim 1, wherein providing said slurry having a plurality of particulate abrasive agent colloidal silica soot includes providing soot particles having a particle surface area no greater than 20 m²/gram.

25. A semiconductor processing method as claimed in claim 1, wherein providing said slurry having a plurality of particulate abrasive agent colloidal silica soot includes providing soot particles having a particle surface area in the range of about 10 to 20 m²/gram.

26. A semiconductor processing method as claimed in claim 1, wherein said slurry has a stabilized dispersion viscosity.

27. A semiconductor processing method as claimed in claim 1, wherein said soot have a surface activity $\geq 1.5 \times 10^{-5}$ moles/meter.

28. A semiconductor processing method as claimed in claim 1, wherein said soot have an intrinsic $pK_{a1}$ of $0.0\pm0.2$ and an intrinsic $pK_{a2}$ of $7.0\pm0.1$.

29. A semiconductor processing method as claimed in claim 1, wherein said soot particles have an isoelectric point ($pH_{IEP}$) of $3.5\pm0.1$.

30. A semiconductor processing method as claimed in claim 1, wherein said soot are coated with cerium, iron, zirconium, aluminum or oxides formed thereof.

31. A semiconductor processing method as claimed in claim 1, wherein said soot have an intrinsic $pK_{a1}$ of $0.0\pm0.1$ and an intrinsic $pK_{a2}$ of $5.0\pm0.2$.

32. A semiconductor processing method as claimed in claim 1, wherein said soot have an isoelectric point ($pH_{IEP}$) of $2.5\pm0.1$.

33. A method as claimed in claim 12, wherein said Ti doped fused silica glass soot particles have an increased insolution surface charge.

34. A method as claimed in 33, wherein said Ti doped fused silica glass soot particles have an increased low pH stability insolution at pH values <5.0.

35. A method as claimed in claim 1, wherein said colloidal silica soot has an insolution stability with said particles agglomeration resistant.

36. A method as claimed in claim 1, wherein said colloidal silica soot has an insolution stability with said particles gellation resistant.

37. A method as claimed in claim 1, wherein said colloidal silica soot has an insolution stability with said particles in said slurry having a stabilized viscosity.

38. A chemical-mechanical semiconductor integrated circuit manufacturing process, said process comprising:
providing a semiconductor integrated circuit workpiece,
providing a chemical-mechanical fused silica soot slurry, said slurry comprised of a plurality of particulate abrasive agent colloidal solid sphere fused silica soot particles,
planarizing said semiconductor integrated circuit workpiece with said fused silica soot slurry to provide a processed semiconductor integrated circuit workpiece surface.

39. A semiconductor manufacturing process as claimed in claim 38, wherein providing a semiconductor integrated circuit workpiece includes forming a semiconductor integrated circuit film and planarizing includes planarizing said film.

40. A process as claimed in claim 39, wherein forming a film includes forming a tungsten film.

41. A process as claimed in claim 39, wherein forming a film includes forming a tungsten silicide film.

42. A process as claimed in claim 39, wherein forming a film includes forming a copper film.

43. A process as claimed in claim 39, wherein forming a film includes forming a titanium nitride film.

44. A process as claimed in claim 39, wherein forming a film includes forming an aluminum alloy film.

45. A process as claimed in claim 39, wherein forming a film includes forming a tantalum film.

46. A process as claimed in claim 39, wherein forming a film includes forming a tantalum nitride film.

47. A process as claimed in claim 38, wherein providing a semiconductor integrated circuit workpiece includes providing a semiconductor integrated circuit workpiece with an interlayer dielectric.

48. A process as claimed in claim 38, wherein providing a semiconductor integrated circuit workpiece includes providing a semiconductor integrated circuit workpiece with a conductive layer.

49. A process as claimed in claim 38, wherein planarizing said workpiece includes polishing back at least one deposited layer to form a metallized plug.

50. A process as claimed in claim 38, wherein planarizing said workpiece includes polishing back at least one deposited layer to form a plurality of interconnection lines.

51. A process as claimed in claim 38, wherein said soot particles have a particle size distribution between 30 nm and 600 nm.

52. A process as claimed in claim 38, wherein providing said slurry having a plurality of particulate abrasive agent colloidal silica soot particles includes providing high purity fused silica soot particles.

53. A process as claimed in claim 38, wherein providing said slurry having a plurality of particulate abrasive agent colloidal silica soot particles includes providing doped fused silica glass soot particles.

54. A process as claimed in claim 38, wherein providing said slurry having a plurality of particulate abrasive agent colloidal silica soot particles includes providing Ti doped fused silica glass soot particles.

55. A process as claimed in claim 38, wherein providing said slurry having a plurality of particulate abrasive agent colloidal silica soot includes providing Ti doped fused silica glass soot particles with a mean particle size in the range of 300 nm to 500 nm.

56. A process as claimed in claim 38, wherein providing said slurry having a plurality of particulate abrasive agent colloidal silica soot includes providing soot particles having a particle surface area less than 100 m²/gram.

57. A process as claimed in claim 38, wherein providing said slurry having a plurality of particulate abrasive agent colloidal silica soot includes providing soot particles having a particle surface area no greater than 50 m²/gram.

58. A process as claimed in claim 38, wherein providing said slurry having a plurality of particulate abrasive agent colloidal silica soot includes providing soot particles having a particle surface area no greater than 20 m²/gram.

59. A process as claimed in claim 38, wherein providing said slurry having a plurality of particulate abrasive agent colloidal silica soot includes providing soot particles having a particle surface area in the range of about 10 to 20 m²/gram.

60. A process as claimed in claim 38, wherein said slurry has a stabilized dispersion viscosity.

61. A process as claimed in claim 38, wherein said soot have a surface activity $\geq 1.5 \times 10^{-5}$ moles/meter.

62. A process as claimed in claim 38, wherein said soot are coated with cerium, iron, zirconium, aluminum or oxides formed thereof.

63. A process as claimed in claim 38, wherein said colloidal silica soot has an insolution stability with said particles agglomeration resistant.

64. A process as claimed in claim 38, wherein said colloidal silica soot has an insolution stability with said particles gellation resistant.

65. A process as claimed in claim 38, wherein said colloidal silica soot has an insolution stability with said particles in said slurry having a stabilized viscosity.

66. A method of making a semiconductor processing chemical-mechanical planarizing slurry, said method comprising:
providing a plurality of particulate abrasive agent solid sphere fused silica soot particles,
providing a semiconductor processing chemical-mechanical pre-slurry solvent,
dispersing said particulate abrasive agent colloidal solid sphere fused silica soot particles in said semiconductor processing chemical-mechanical pre-slurry solvent to form a semiconductor processing chemical-mechanical planarizing slurry.

67. A method as claimed in claim 66, said method including loading greater than 3 wt. % of said solid sphere fused silica soot particles in said chemical-mechanical solvent and dispersing said soot particles to form a semiconductor processing chemical-mechanical slurry with colloidal solid sphere fused silica soot wherein an agglomeration of said solid sphere fused silica soot is inhibited.

68. A method as claimed in claim 66, said method including loading greater than 3 wt. % of said solid sphere fused silica soot particles in said chemical-mechanical solvent and dispersing said soot particles to form a semiconductor processing chemical-mechanical slurry with colloidal solid sphere fused silica soot wherein a gellation of said slurry is inhibited.

69. A method as claimed in claim 66, said method including loading greater than 3 wt. % of said solid sphere fused silica soot particles in said chemical-mechanical solvent and dispersing said soot particles to form a semiconductor processing chemical-mechanical slurry with colloidal solid sphere fused silica soot wherein said slurry has a stabilized viscosity.

70. A method as claimed in claim 66, wherein providing said plurality of particulate abrasive agent silica soot includes providing a plurality of non-agglomerated solid sphere fused silica soot particles with a particle size distribution between 30 nm and 600 nm.

71. A method as claimed in claim 66, wherein providing said slurry having a plurality of particulate abrasive agent silica soot includes providing high purity fused silica soot particles.

72. A method as claimed in claim 66, wherein providing said slurry having a plurality of particulate abrasive agent silica soot includes providing doped fused silica glass soot particles.

73. A method as claimed in claim 66, wherein providing said slurry having a plurality of particulate abrasive agent silica soot includes providing Ti doped fused silica glass soot particles.

74. A method as claimed in claim 66, wherein providing said plurality of particulate abrasive agent silica soot includes providing Ge doped fused silica glass soot particles.

75. A method as claimed in claim 66, wherein providing said slurry having a plurality of particulate abrasive agent colloidal silica soot includes providing Al doped fused silica glass soot particles.

76. A method as claimed in claim 66, wherein providing said plurality of particulate abrasive agent silica soot includes providing B doped fused silica glass soot particles.

77. A method as claimed in claim 66, wherein providing said plurality of particulate abrasive agent silica soot includes providing P doped fused silica glass soot particles.

78. A method as claimed in claim 66, wherein providing said plurality of particulate abrasive agent silica soot includes providing Zr doped fused silica glass soot particles.

79. A method as claimed in claim 66, wherein providing said plurality of particulate abrasive agent silica soot includes providing Er doped fused silica glass soot particles.

80. A method as claimed in claim 66, wherein providing said plurality of particulate abrasive agent silica soot includes providing Ce doped fused silica glass soot particles.

81. A method as claimed in claim 66, wherein providing said plurality of particulate abrasive agent silica soot includes providing periodic table of elements lanthanide series metal doped fused silica glass soot particles.

82. A method as claimed in claim 66, wherein providing said plurality of particulate abrasive agent silica soot includes providing soot particles having a mean particle size in the range of 0.3 to 0.5 µm.

83. A method as claimed in claim 66, wherein providing said plurality of particulate abrasive agent silica soot includes providing soot particles having a particle surface area less than 100 $m^2$/gram.

84. A method as claimed in claim 66, wherein providing said plurality of particulate abrasive agent silica soot includes providing soot particles having a particle surface area no greater than 50 $m^2$/gram.

85. A method as claimed in claim 66, wherein providing said plurality of particulate abrasive agent silica soot includes providing soot particles having a particle surface area no greater than 20 $m^2$/gram.

86. A method as claimed in claim 66, wherein providing said plurality of particulate abrasive agent silica soot includes providing soot particles having a particle surface area in the range of about 10 to 20 $m^2$/gram.

87. A method as claimed in claim 66, wherein said soot have a surface activity $\geq 1.5 \times 10^{-5}$ moles/meter.

88. A method as claimed in claim 66, wherein said soot have an intrinsic $pK_{a1}$ of 0.0±0.2 and an intrinsic $pK_{a2}$ of 7.0±0.1.

89. A method as claimed in claim 66, wherein said soot particles have an isoelectric point ($pH_{IEP}$) of 3.5±0.1.

90. A method as claimed in claim 66, wherein said soot are coated with cerium, iron, zirconium, aluminum or oxides formed thereof.

91. A method as claimed in claim 66, wherein said soot have an intrinsic $pK_{a1}$ of 0.0±0.1 and an intrinsic $pK_{a2}$ of 5.0±0.2.

92. A method as claimed in claim 66, wherein said soot have an isoelectric point ($pH_{IEP}$) of 2.5±0.1.

93. A method as claimed in claim 73, wherein said Ti doped fused silica glass soot particles have an increased insolution surface charge.

94. A method as claimed in 93, wherein said Ti doped fused silica glass soot particles have an increased low pH stability insolution at pH values <5.0.

95. A method as claimed in claim 66, wherein providing said plurality of solid sphere fused silica soot particles includes collecting a plurality of fused silica soot particles as a byproduct from a chemical vapor deposition glass making process.

96. A method as claimed in claim 95, wherein collecting includes collecting a plurality of high purity fused silica soot particles as a byproduct from a direct deposition high purity fused silica glass making process.

97. A method as claimed in claim 95, wherein collecting includes collecting a plurality of Ti doped fused silica glass soot particles as a byproduct from an ultra low expansion glass making process.

98. A method as claimed in claim 95, wherein collecting includes collecting a plurality of fused silica soot particles as a byproduct from an optical waveguide glass making process.

99. A method as claimed in claim 95, wherein providing said soot particles includes sedimentation/floatation separating said byproduct soot particles from a glass making process contaminant.

100. A method as claimed in claim 66, wherein providing said soot particles includes:
 providing a conversion site,
 maintaining the conversion site at temperatures above 1600° C.;
 producing a conversion site flame, introducing a silicon feedstock compound into said conversion site flame, generating a plurality of high purity silica presoot intermediates;
 keeping said pre-soot silica intermediates under prolonged residence times at the temperature above 1600° C.; and
 growing and sintering said pre-soot silica intermediates simultaneously into fused silica soot spheres before collecting said soot particles.

101. A semiconductor processing chemical-mechanical planarizing slurry, said slurry comprised of a plurality of particulate abrasive agent colloidal solid sphere fused silica soot particles dispersed in a semiconductor processing chemical-mechanical slurry solvent with said particulate abrasive agent colloidal solid sphere fused silica soot particles being non-agglomerated solid sphere fused silica soot particles with a particle surface area no greater than 50 m²/gram.

102. A semiconductor processing chemical-mechanical planarizing slurry as claimed in claim 101, wherein said soot particles are doped fused silica glass soot particles.

103. A semiconductor processing chemical-mechanical planarizing slurry as claimed in claim 101, wherein said soot particles are high purity fused silica soot particles, doped fused silica glass soot particles.

104. A semiconductor processing chemical-mechanical planarizing slurry as claimed in claim 101, wherein said soot particles have a particle surface area no greater than 20 m²/gram.

105. A semiconductor processing chemical-mechanical planarizing slurry as claimed in claim 101, wherein said slurry has a stabilized dispersion viscosity.

106. A semiconductor processing chemical-mechanical planarizing slurry as claimed in claim 101, wherein said soot have a surface activity $\geq 1.5 \times 10^{-5}$ moles/meter.

107. A semiconductor processing chemical-mechanical planarizing slurry as claimed in claim 101, wherein said soot particles have an intrinsic $pK_{a1}$ of $0.0 \pm 0.2$ and an intrinsic $pK_{a2}$ of $7.0 \pm 0.1$.

108. A semiconductor processing chemical-mechanical planarizing slurry as claimed in claim 101, wherein said soot particles have an isoelectric point ($pH_{IEP}$) of $3.5 \pm 0.1$.

109. A semiconductor processing chemical-mechanical planarizing slurry as claimed in claim 101, wherein said soot are coated with cerium, iron, zirconium, aluminum or oxides formed thereof.

110. A semiconductor processing chemical-mechanical planarizing slurry as claimed in claim 101, wherein said soot particles have an intrinsic $pK_{a1}$ of $0.0 \pm 0.1$ and an intrinsic $pK_{a2}$ of $5.0 \pm 0.2$.

111. A semiconductor processing chemical-mechanical planarizing slurry as claimed in claim 101, wherein said soot particles have an isoelectric point ($pH_{IEP}$) of $2.5 \pm 0.1$.

112. A semiconductor processing chemical-mechanical planarizing slurry as claimed in claim 101, wherein said soot is Ti doped fused silica glass soot with an increased insolution surface charge.

113. A semiconductor processing chemical-mechanical planarizing slurry as claimed in claim 101, wherein said soot is Ti doped fused silica glass soot with an increased low pH stability insolution at pH values <5.0.

114. A semiconductor processing chemical-mechanical planarizing slurry as claimed in claim 101, wherein said colloidal silica soot has an insolution stability with said particles agglomeration resistant.

115. A semiconductor processing chemical-mechanical planarizing slurry as claimed in claim 101, wherein said colloidal silica soot has an insolution stability with said particles gellation resistant.

116. A semiconductor processing chemical-mechanical planarizing slurry as claimed in claim 101, wherein said colloidal silica soot has an insolution stability with said particles in said slurry having a stabilized viscosity.

* * * * *